United States Patent
Begley et al.

(10) Patent No.: US 7,767,317 B2
(45) Date of Patent: *Aug. 3, 2010

(54) ORGANIC ELEMENT FOR LOW VOLTAGE ELECTROLUMINESCENT DEVICES

(75) Inventors: William J. Begley, Webster, NY (US); Manju Rajeswaran, Fairport, NY (US); Tukaram K. Hatwar, Penfield, NY (US); Natasha Andrievsky, Webster, NY (US)

(73) Assignee: Global OLED Technology LLC, Wilmington, DE (US)

( * ) Notice: Subject to any disclaimer, the term of this patent is extended or adjusted under 35 U.S.C. 154(b) by 947 days.

This patent is subject to a terminal disclaimer.

(21) Appl. No.: 11/259,586

(22) Filed: Oct. 26, 2005

(65) Prior Publication Data

US 2007/0092756 A1    Apr. 26, 2007

(51) Int. Cl.
*H01L 51/54* (2006.01)
*H01J 1/62* (2006.01)

(52) U.S. Cl. .................. 428/690; 428/917; 313/504; 313/506; 257/102; 257/103

(58) Field of Classification Search ................ 428/690, 428/917; 313/504, 506; 257/102, 103
See application file for complete search history.

(56) References Cited

U.S. PATENT DOCUMENTS 5,516,577 A    5/1996 Matsuura et al. ............ 428/212

(Continued)

FOREIGN PATENT DOCUMENTS

JP    9-176629    7/1997

(Continued)

OTHER PUBLICATIONS

W. J. Begley, et al., "Organic Light-Emitting Devices with Mixed Electron Transport Materials", U.S. Appl. No. 11/076,821, filed Mar. 10, 2005.

(Continued)

*Primary Examiner*—D. Lawrence Tarazano
*Assistant Examiner*—Camie S Thompson
(74) *Attorney, Agent, or Firm*—McKenna Long & Aldridge LLP

(57) ABSTRACT

An OLED device comprises a cathode, a light emitting layer and an anode, in that order, and, having located between the cathode and the light emitting layer, a further layer containing;
(a) 10 vol % or more of a carbocyclic fused ring aromatic compound, and (b) a cyclometallated complex represented by Formula (4')

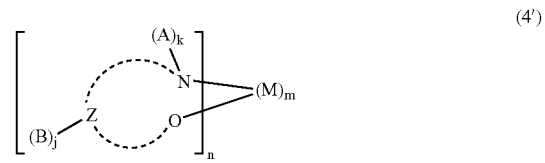

wherein:
Z and the dashed arc represent two or three atoms and the bonds necessary to complete a 5- or 6-membered ring with M;
each A represents H or a substituent and each B represents an independently selected substituent on the Z atoms, provided that two or more substituents may combine to form a fused ring or a fused ring system;
j is 0-3 and k is 1 or 2;
M represents a Group IA, IIA, IIIA and IIB element of the Periodic Table; and
m and n are independently selected integers selected to provide a neutral charge on the complex; and
provided that the complex does not contain the 8-hydroxyquinolate ligand. Such devices exhibit reduce drive voltage while maintaining good luminance.

15 Claims, 1 Drawing Sheet

U.S. PATENT DOCUMENTS

| | | | |
|---|---|---|---|
| 5,716,722 A | 2/1998 | Hamada et al. | 428/690 |
| 6,396,209 B1 | 5/2002 | Kodo et al. | 313/504 |
| 6,509,109 B1 | 1/2003 | Nakamura et al. | 428/690 |
| 6,558,817 B1 | 5/2003 | Ueda et al. | 428/690 |
| 6,720,573 B2 | 4/2004 | Son et al. | 257/40 |
| 7,126,271 B2 | 10/2006 | Lee et al. | 313/506 |
| 2001/0052751 A1 | 12/2001 | Wakimoto et al. | 313/504 |
| 2002/0086180 A1 | 7/2002 | Seo et al. | 428/690 |
| 2003/0044643 A1 | 3/2003 | Arakane et al. | 428/690 |
| 2003/0077480 A1 | 4/2003 | Hosokawa et al. | 428/690 |
| 2004/0207318 A1 | 10/2004 | Lee et al. | 313/506 |
| 2004/0247937 A1 | 12/2004 | Chen et al. | 428/690 |
| 2005/0019605 A1 | 1/2005 | Kwong et al. | 428/690 |
| 2005/0084713 A1 | 4/2005 | Kido et al. | 428/690 |
| 2005/0095451 A1 | 5/2005 | Begley et al. | 428/690 |
| 2005/0098207 A1 | 5/2005 | Matsumoto et al. | 136/263 |
| 2005/0106412 A1 | 5/2005 | Kathirgamanathan | 428/690 |
| 2005/0233166 A1 | 10/2005 | Ricks et al. | 428/690 |
| 2007/0092754 A1* | 4/2007 | Begley et al. | 428/690 |

FOREIGN PATENT DOCUMENTS

| | | |
|---|---|---|
| JP | 2003338377 | 11/2003 |
| WO | 03/046107 | 6/2003 |

OTHER PUBLICATIONS

W. J. Begley, et al., "Electroluminescent Devices with Mixed Electron Transport Materials", U.S. Appl. No. 11/215,505, filed Aug. 30, 2005.

W. J. Begley, et al., "Organic Light-Emitting Devices with Mixed Electron Transport Materials", U.S. Appl. No. 11/077,218, filed Mar. 10, 2005.

W. J. Begley, et al., "Phosphorescent OLED with Mixed Electron Transport Materials", U.S. Appl. No. 11/116,096, filed Apr. 27, 2005.

W. J. Begley, et al., "Organic Element for Low Voltage Electroluminescent Devices", U.S. Appl. No. 11/259,472, filed Oct. 26, 2005.

W. J. Begley, et al., "Organic Element for Low Voltage Electroluminescent Devices", U.S. Appl. No. 11/258,671, filed Oct. 26, 2005.

W. J. Begley, et al., "Organic Element for Low Voltage Electroluminescent Devices", U.S. Appl. No. 11/259,290, filed Oct. 26, 2005.

W. J. Begley, et al., "Organic Element for Low Voltage Electroluminescent Devices", U.S. Appl. No. 11/258,740, filed Oct. 26, 2005.

W. J. Begley, et al., "Organic Element for Low Voltage Electroluminescent Devices", U.S. Appl. No. 11/258,719, filed Oct. 26, 2005.

Zhryuan et al., Chinese Journal of Semiconductors, vol. 21, Part 2 (2000), pp. 184-187.

* cited by examiner

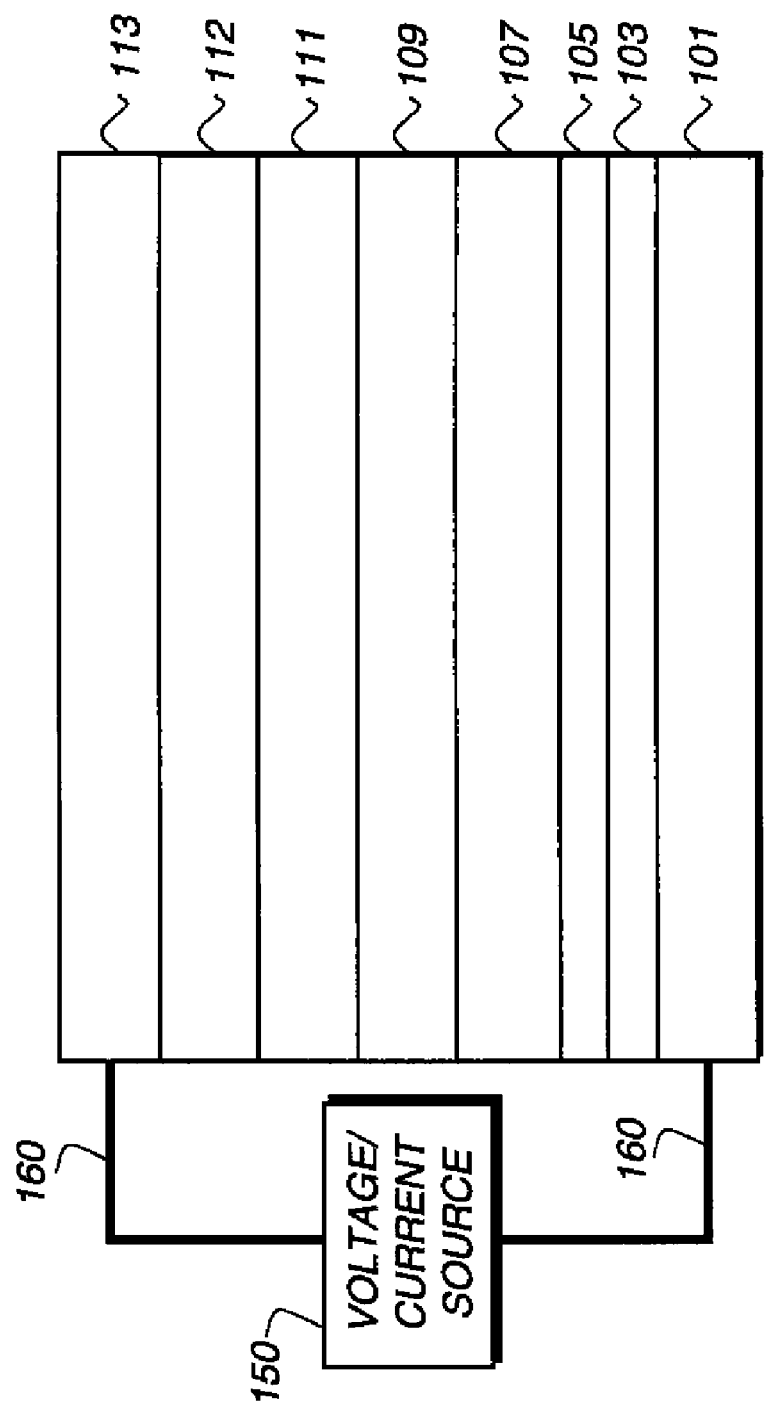

ORGANIC ELEMENT FOR LOW VOLTAGE ELECTROLUMINESCENT DEVICES

FIELD OF THE INVENTION

This invention relates to an organic light-emitting diode (OLED) electroluminescent (EL) device having a light-emitting layer and a layer between the light-emitting layer and the cathode containing a carbocyclic fused ring aromatic compound and a complex of a Group IA, IIA, IIIA of IIB metal.

BACKGROUND OF THE INVENTION

While organic electroluminescent (EL) devices have been known for over two decades, their performance limitations have represented a barrier to many desirable applications. In simplest form, an organic EL device is comprised of an anode for hole injection, a cathode for electron injection, and an organic medium sandwiched between these electrodes to support charge recombination that yields emission of light. These devices are also commonly referred to as organic light-emitting diodes, or OLEDs. Representative of earlier organic EL devices are Gurnee et al. U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, 30, 322, (1969); and Dresner U.S. Pat. No. 3,710,167, issued Jan. 9, 1973. The organic layers in these devices, usually composed of a polycyclic aromatic hydrocarbon, were very thick (much greater than 1 μm). Consequently, operating voltages were very high, often greater than 100V.

More recent organic EL devices include an organic EL element consisting of extremely thin layers (e.g. <1.0 μm) between the anode and the cathode. Herein, the term "organic EL element" encompasses the layers between the anode and cathode. Reducing the thickness lowered the resistance of the organic layers and has enabled devices that operate at much lower voltage. In a basic two-layer EL device structure, described first in U.S. Pat. No. 4,356,429, one organic layer of the EL element adjacent to the anode is specifically chosen to transport holes, and therefore is referred to as the hole-transporting layer, and the other organic layer is specifically chosen to transport electrons and is referred to as the electron-transporting layer. Recombination of the injected holes and electrons within the organic EL element results in efficient electroluminescence.

There have also been proposed three-layer organic EL devices that contain an organic light-emitting layer (LEL) between the hole-transporting layer and electron-transporting layer, such as that disclosed by C. Tang et al. (*J. Applied Physics*, Vol. 65, 3610 (1989)). The light-emitting layer commonly consists of a host material doped with a guest material, otherwise known as a dopant. Still further, there has been proposed in U.S. Pat. No. 4,769,292 a four-layer EL element comprising a hole injecting layer (HIL), a hole-transporting layer (HTL), a light-emitting layer (LEL) and an electron-transporting/injecting layer (ETL). These structures have resulted in improved device efficiency.

Since these early inventions, further improvements in device materials have resulted in improved performance in attributes such as color, stability, luminance efficiency and manufacturability, e.g., as disclosed in U.S. Pat. No. 5,061,569, U.S. Pat. No. 5,409,783, U.S. Pat. No. 5,554,450, U.S. Pat. No. 5,593,788, U.S. Pat. No. 5,683,823, U.S. Pat. No. 5,908,581, U.S. Pat. No. 5,928,802, U.S. Pat. No. 6,020,078, and U.S. Pat. No. 6,208,077, amongst others.

Notwithstanding these developments, there are continuing needs for organic EL device components, such as light-emitting materials, sometimes referred to as dopants, that will provide high luminance efficiencies combined with high color purity and long lifetimes. In particular, there is a need to be able to adjust the emission wavelength of the light-emitting material for various applications. For example, in addition to the need for blue, green, and red light-emitting materials there is a need for blue-green, yellow and orange light-emitting materials in order to formulate white-light emitting electroluminescent devices. For example, a device can emit white light by emitting a combination of colors, such as blue-green light and red light or a combination of blue light and yellow light.

The preferred spectrum and precise color of a white EL device will depend on the application for which it is intended. For example, if a particular application requires light that is to be perceived as white without subsequent processing that alters the color perceived by a viewer, it is desirable that the light emitted by the EL device have 1931 Commission International d'Eclairage (CIE) chromaticity coordinates, (CIEx, CIEy), of about (0.33, 0.33). For other applications, particularly applications in which the light emitted by the EL device is subjected to further processing that alters its perceived color, it can be satisfactory or even desirable for the light that is emitted by the EL device to be off-white, for example bluish white, greenish white, yellowish white, or reddish white.

White EL devices can be used with color filters in full-color display devices. They can also be used with color filters in other multicolor or functional-color display devices. White EL devices for use in such display devices are easy to manufacture, and they produce reliable white light in each pixel of the displays. Although the OLEDs are referred to as white, they can appear white or off-white, for this application, the CIE coordinates of the light emitted by the OLED are less important than the requirement that the spectral components passed by each of the color filters be present with sufficient intensity in that light. Thus there is a need for new materials that provide high luminance intensity for use in white OLED devices.

A useful class of electron-transporting materials is that derived from metal chelated oxinoid compounds including chelates of oxine itself, also commonly referred to as 8-quinolinol or 8-hydroxyquinoline. Tris(8-quinolinolato)aluminum (III), also known as Alq or $Alq_3$, and other metal and non-metal oxine chelates are well known in the art as electron-transporting materials.

Tang et al., in U.S. Pat. No. 4,769,292 and VanSlyke et al., in U.S. Pat. No. 4,539,507 lower the drive voltage of the EL devices by teaching the use of Alq as an electron transport material in the luminescent layer or luminescent zone.

Baldo et al., in U.S. Pat. No. 6,097,147 and Hung et al., in U.S. Pat. No. 6,172,459 teach the use of an organic electron-transporting layer adjacent to the cathode so that when electrons are injected from the cathode into the electron-transporting layer, the electrons traverse both the electron-transporting layer and the light-emitting layer.

The use of a mixed layer of a hole-transporting material and an electron-transporting material in the light-emitting layer is well known. For example, see US 2004/0229081; U.S. Pat. No. 6,759,146, U.S. Pat. No. 6,759,146; U.S. Pat. No. 6,753,098; and U.S. Pat. No. 6,713,192 and references cited therein. Kwong and co-workers, US 2002/0074935, describe a mixed layer comprising an organic small molecule hole-transporting material, an organic small molecule electron-transporting material and a phosphorescent dopant.

Tamano et al., in U.S. Pat. No. 6,150,042 teaches use of hole-injecting materials in an organic EL device. Examples of electron-transporting materials useful in the device are given and included therein are mixtures of electron-transporting materials.

Seo et al., in US2002/0086180 teaches the use of a 1:1 mixture of Bphen, (also known as 4,7-diphenyl-11,10-phenanthroline or bathophenanthroline) as an electron-transporting material, and Alq as an electron injection material, to form an electron-transporting mixed layer. However, the Bphen/Alq mix of Seo et al., shows inferior stability.

US 2004/0207318 and U.S. Pat. No. 6,396,209 describe an OLED structure including a mixed layer of an electron-transporting organic compound and an organic metal complex compound containing at least one of alkali metal ion, alkali earth metal ion, or rare earth metal ion.

JP 2000053957 teaches the use of photogenes and WO 9963023 the use of organometallic complexes useful in the luminescent layer or the electron injecting/transporting layers but do not teach the use of mixtures of such materials for the electron injecting/transporting layer.

US 2004/0067387 teaches the use of one or more compounds of Formula I, an anthracene structure, in the electron-transporting/electron-injecting layer(s) and one or more compounds not of Formula I including $Alq_3$ may be added. $Alq_3$ is not a useful component in the current invention.

U.S. Pat. No. 6,468,676 teaches the use of an organic metal salt, a halogenide, or an organic metal complex for the electron-injection layer. The organic metal complex is at least one selected from a list of metal complexes. There is no indication of mixing a carbocyclic compound.

Zhryuan et al., in Chinese Journal of SemiConductors, Vol. 21, Part 2 (2000), page 184 teaches mixtures of rubrene and phenylpyridine beryllium($BePP_2$) as a yellow emitting layer for white OLED. Use of rubrene as a dopant necessitates the rubrene to be present in 2-3 volume %.

Commonly assigned U.S. Ser. Nos. 11/076,821; 11/077,218; and 11/116,096 describe mixing a first compound with a second compound that is a low voltage electron transport material, to form a layer on the cathode side of the emitting layer in an OLED device, which gives an OLED device that has a drive voltage even lower than that of the device with the low voltage electron transport material. In some cases a metallic material based on a metal having a work function less than 4.2 eV is included in the layer.

Organometallic complexes, such as lithium quinolate (also known as lithium 8-hydroxyquinolate, lithium 8-quinolate, 8-quinolinolatolithium, or Liq) have been used in EL devices, for example see WO 0032717 and US 2005/0106412. In particular mixtures of lithium quinolate and Alq have been described as useful, for example see U.S. Pat. No. 6,396,209 and US 2004/0207318.

However, these devices do not have all desired EL characteristics in terms of high luminance in combination with low drive voltages. Thus, notwithstanding these developments, there remains a need to reduce drive voltage of OLED devices while maintaining good luminance.

SUMMARY OF THE INVENTION

The invention provides an OLED device comprising a cathode, a light emitting layer and an anode, in that order, and, having located between the cathode and the light emitting layer, a further layer containing:

(a) 10 vol % or more of a carbocyclic fused ring aromatic compound, and (b) a cyclometallated complex represented by Formula (4')

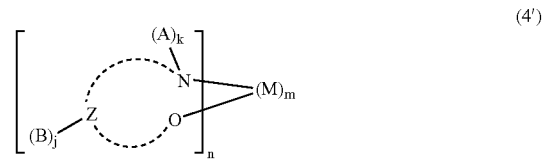

wherein:

Z and the dashed arc represent two or three atoms and the bonds necessary to complete a 5- or 6-membered ring with M;

each A represents H or a substituent and each B represents an independently selected substituent on the Z atoms, provided that two or more substituents may combine to form a fused ring or a fused ring system;

j is 0-3 and k is 1 or 2;

M represents a Group IA, IIA, IIIA and IIB element of the Periodic Table; and m and n are independently selected integers selected to provide a neutral charge on the complex; and provided that the complex does not contain the 8-hydroxyquinolate ligand.

Such devices exhibit reduce drive voltage while maintaining good luminance.

BRIEF DESCRIPTION OF THE DRAWINGS

The FIGURE shows a cross-sectional schematic view of one embodiment of the device of the present invention.

DETAILED DESCRIPTION OF THE INVENTION

The OLED devices in all aspects of this invention include a cathode, a light emitting layer and an anode in that order. As used herein two layers are "adjacent" if one layer is juxtaposed with and shares a common boundary with the other layer.

In a first aspect of the invention, the OLED device has located between the cathode and the light-emitting layer, a layer containing more than 10-volume % of a carbocyclic fused ring aromatic compound and at least one salt or complex of an alkali or alkaline earth metal.

In a second aspect of the invention, the light-emitting layer can comprise of up to 10 volume % of a light emitting compound with at least one anthracene host compound and a further layer located between the cathode and the light emitting layer, containing 10-volume % or more of an anthracene compound and at least one salt or complex of a group IA, IIA, IIIA, or IIB element. The anthracene compounds in the light emitting layer and the further layer can be the same or different.

In a third aspect of the invention, a further layer is located between the cathode and the light emitting layer that contains 10-volume % or more of a carbocyclic fused ring aromatic compound, and a cyclometallated complex.

In a fourth aspect of the invention, a further layer contains a single cyclometallated complex located between the cathode and the light-emitting layer.

In a fifth aspect of the invention, the OLED device comprises a further layer located between the cathode and the light emitting layer, containing more than 10-volume % of a carbocyclic fused ring aromatic compound, and at least one salt or complex of a group IA, IIA, IIIA, or IIB element. Also, an additional layer, located between the anode and the light-emitting layer, contains a compound with at least one electron-withdrawing substituent having a Hammett's sigma para value of at least 0.3.

In a sixth aspect of the invention, the light emitting layer of the OLED device comprises at least one light emitting compound selected from amine containing monostyryl, amine containing distyryl, amine containing tristyryl and amine containing tetrastyryl compounds. The OLED also comprises a further layer, located between the cathode and the light emitting layer and contains 10-volume % or more of a carbocyclic fused ring aromatic compound and at least one salt or complex of a group IA, IIA, IIIA, or IIB element.

For the purpose of the different aspects of this invention, the terms complex, organic complex and cyclometallated complex describe the complexation of an alkali or alkaline earth metal with an organic molecule via coordinate or dative bonding. The molecule, acting as a ligand, can be mono-, di-, tri- or multi-dentate in nature, indicating the number of potential coordinating atoms in the ligand. It should be understood that the number of ligands surrounding a metal ion should be sufficient to render the complex electrically neutral. In addition, it should be understood that a complex can exist in different crystalline forms in which there can be more than one metal ion present from form to form, with sufficient ligands present to impart electrical neutrality.

The definition of a coordinate or dative bond can be found in *Grant & Hackh's Chemical Dictionary*, page 91. In essence, a coordinate or dative bond is formed when electron rich atoms such as O or N, donate a pair of electrons to electron deficient atoms such as Al or B. One such example is found in tris(8-quinolinolato)aluminum(III), also referred to as Alq, wherein the nitrogen on the quinoline moiety donates its lone pair of electrons to the aluminum atom thus forming a heterocyclic or cyclometallated ring, called a complex and hence providing Alq with a total of 3 fused rings. The same applies to Liq.

As used herein and throughout this application, the term carbocyclic and heterocyclic rings or groups are generally as defined by the *Grant & Hackh's Chemical Dictionary*, Fifth Edition, McGraw-Hill Book Company. A carbocyclic ring is any aromatic or non-aromatic ring system containing only carbon atoms and a heterocyclic ring is any aromatic or non-aromatic ring system containing both carbon and non-carbon atoms such as nitrogen (N), oxygen (O), sulfur (S), phosphorous (P), silicon (Si), gallium (Ga), boron (B), beryllium (Be), indium (In), aluminum (Al), and other elements found in the periodic table useful in forming ring systems. Also, for the purpose of the aspects of this invention, also included in the definition of a heterocyclic ring are those rings that include coordinate or dative bonds.

In the first aspect of the invention, the inventive layer includes more than 10-volume % of a carbocyclic fused ring aromatic compound and at least one salt or complex of an alkali or alkaline earth metal. In one desirable embodiment the carbocyclic compound is a tetracene, such as for example, rubrene.

Suitably, the carbocyclic fused ring aromatic compound may be represented by Formula (1).

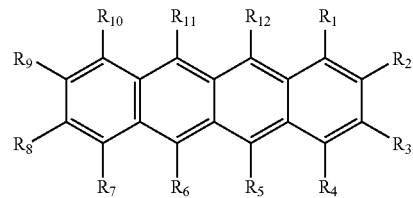

In Formula (1), $R_1, R_2, R_3, R_4, R_5, R_6, R_7, R_8, R_9, R_{10}, R_{11}$, and $R_{12}$ are independently selected as hydrogen or substituent groups, provided that any of the indicated substituents may join to form further fused rings. In one desirable embodiment, $R_1, R_4, R_7$, and $R_{10}$ represent hydrogen and $R_5, R_6, R_{11}$, and $R_{12}$ represent independently selected aromatic ring groups.

In a further embodiment, the carbocyclic fused ring aromatic compound may be represented by Formula (2).

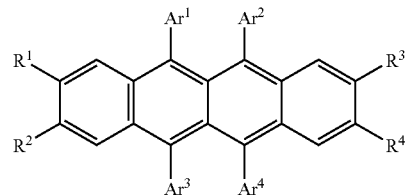

In Formula (2), $Ar^1$—$Ar^4$ represent independently selected aromatic groups, for example, phenyl groups, tolyl groups, naphthyl groups, 4-biphenyl groups, or 4-t-butylphenyl groups. In one suitable embodiment, $Ar^1$ and $Ar^4$ represent the same group, and independently of $Ar^1$ and $Ar^4$, $Ar^2$ and $Ar^3$ are the same.

$R^1$-$R^4$ independently represent hydrogen or a substituent, such as a methyl group, a t-butyl group, or a fluoro group. In one embodiment $R^1$ and $R^4$ are not hydrogen and represent the same group.

In another embodiment, the carbocyclic compound is an anthracene group. Particularly useful compounds are those of Formula (3).

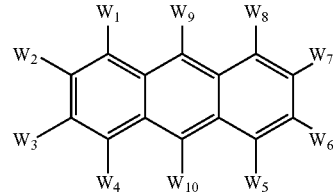

In Formula (3), $W_1$-$W_{10}$ independently represent hydrogen or an independently selected substituent, provided that two adjacent substituents can combine to form rings. In one embodiment of the invention $W_1$-$W_{10}$ are independently selected from hydrogen, alkyl, aromatic carbocyclic and aromatic heterocyclic groups. In another embodiment of the invention, $W_9$ and $W_{10}$ represent independently selected aromatic carbocyclic and aromatic heterocyclic groups. In yet another embodiment of the invention $W_9$ and $W_{10}$ are independently selected from phenyl, naphthyl and biphenyl groups. For example, $W_9$ and $W_{10}$ may represent such groups as 1-naphthyl, 2-naphthyl, 4-biphenyl, 2-biphenyl and 3-biphenyl. In a desirable embodiment, at least one of $W_9$ and $W_{10}$ represents a carbocyclic group selected from an anthracenyl group (derived from anthracene). Particularly useful anthracene derived groups are 9-anthracenyl groups. In a further aspect of the invention, $W_1$-$W_8$ represent hydrogen or alkyl groups. Particularly useful embodiments of the invention are when $W_9$ and $W_{10}$ are aromatic carbocyclic groups and $W_7$ and $W_3$ are independently selected from hydrogen, alkyl and phenyl groups.

Suitable carbocyclic fused ring aromatic compounds of the naphthacene type can be prepared by methods known in the art. These include forming a naphthacene type material by reacting a propargyl alcohol with a reagent capable of forming a leaving group followed by heating in the presence of a solvent, and in the absence of an oxidizing agent and in the absence of an organic base, to form a naphthacene. See commonly assigned U.S. Ser. Nos. 10/899,821 and 10/899,825 filed Jul. 27, 2004.

A particularly desirable complex of the invention is Liq or one of its derivatives. Liq is a complex of Li$^+$ with 8-hydroxyquinolinate, to give the lithium quinolate complex, also known as lithium 8-quinolate, but often referred to as Liq. Liq can exist as the single species, or in other forms such as $Li_6q_6$ and $Li_nq_n$, where n is an integer and q is the 8-hydroxyquinolate ligand or a derivative In one embodiment the metal complex is represented by Formula (4).

$$(M)_m(Q)_n \quad (4)$$

In Formula (4), M represents an alkali or alkaline earth metal. In one suitable embodiment M is a Group IA metal such as Li$^+$, Na$^+$, K$^+$, Cs$^+$, and Rb$^+$. In one desirable embodiment M represents Li$^+$.

In Formula (4), each Q is an independently selected ligand. Desirably, each Q has a net charge of −1. In one suitable embodiment Q is a bidentate ligand. For example Q can represent an 8-quinolate group.

In Formula (4), n represents an integer, commonly 1-6. Thus the organometallic complex can form dimers, trimers, tetramers, pentamers, hexamers and the like. However, the organometallic complex can also form a one dimensional chain structure in which case n is greater than 6.

In another desirable embodiment, the metal complex is represented by Formula (4')

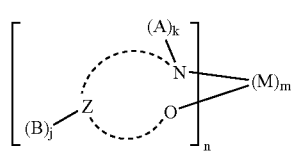

(4')

In Formula (4'), Z and the dashed arc represent two or three atoms and the bonds necessary to complete a 5- or 6-membered ring with M. Each A represents H or a substituent and each B represents an independently selected substituent on the Z atoms, provided that two or more substituents may combine to form a fused ring or a fused ring system. In Formula (4'), j is 0-3 and k is 1 or 2. Also, M represents an alkali metal or alkaline earth metal with m and n independently selected integers selected to provide a neutral charge on the complex.

In another desirable embodiment of the first aspect of the invention, the metal complex is represented by Formula (5).

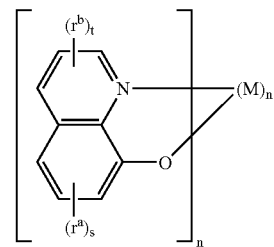

(5)

In Formula (5), M represents an alkali or alkaline earth metal, as described previously. In one desirable embodiment, M represents Li$^+$. Each $r^a$ and $r^b$ represents an independently selected substituent, provided two substituents may combine to form a fused ring group. Examples, of such substituents include a methyl group, a phenyl group, a fluoro substituent and a fused benzene ring group formed by combining two substituents. In Formula (5), t is 1-3, s is 1-3 and n is an integer from 1 to 6.

Formula (6) represents an embodiment of the invention where the ligand of the complex is acetylacetonate or a derivative thereof.

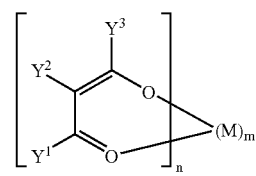

(6)

In Formula (6) $Y^1$, $Y^2$ and $Y^3$ independently represent substituents provided that any of $Y^1$, $Y^2$ and $Y^3$ may combine to form a ring or fused ring system. M is an alkaline or alkaline earth metal with m and n representing integers selected to provide a neutral charge on the complex. In one desirable embodiment of Formula (6), M represents Li$^+$. When the substituents are hydrogen and M represents Li$^+$, Formula (6) then represents lithium acetylacetonate. In addition to hydrogen, examples of other substituents include carbocyclic groups, heterocyclic groups, alkyl groups such as a methyl group, aryl groups such as a phenyl group, or a naphthyl group. A fused ring group may be formed by combining two substituents.

In the second aspect of the invention the light-emitting layer comprises up to 10-volume % of a light emitting compound and at least one anthracene host compound represented by Formula (3). A further layer located between the cathode and the light emitting layer, contains (a) 10-volume % or more of an anthracene compound also of Formula (3) and (b) at least one salt or complex constituting a Group IA, IIA, IIIA and IIB element of the Periodic Table. The anthracene of Formula (3) that is present in both the light emitting layer and the further layer, have the same definition as the anthracene of the first aspect of the invention, previously described. Preferred salts or complexes for this aspect of the invention are composed of alkali metal or alkaline earth metals.

The anthracene host compounds in the light emitting layer and the further layer can be the same compound or they can be different compounds. In one embodiment of the second aspect of the invention, the anthracene compound in the further layer can comprise greater than 10% by volume of the layer.

In further embodiments of the second aspect of the invention, the metal complex can be selected from compounds represented by Formulae (4), (4'), (5), (6) and (7) wherein the M can be selected from Group IA, IIA, IIIA and IIB elements of the Periodic Table. Useful embodiments of the second aspect of the invention include those complexes of Formulae (4), (4'), (5), (6) and (7) wherein M represents a metal selected from the alkali or alkaline earth elements. Particularly useful embodiments of this aspect of the invention are when M in Formulae (4), (4'), (5) and (6) is $Li^+$. A useful metal complex is formed when M in Formula (6) is $Li^+$ to give lithium acetylacetonate and it derivatives, represented by Formula (7)

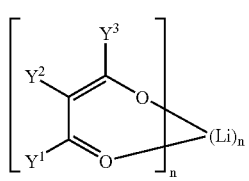

(7)

In Formula (7), $Y^1$, $Y^2$ and $Y^3$ independently represent substituents provided any of $Y^1$, $Y^2$ and $Y^3$ may combine to form a ring or fused ring system and n is an integer. When $Y^1$ and $Y^3$ are methyl groups and $Y^3$ is hydrogen then Formula (7) is the parent lithium acetylacetonate. Other useful derivatives of Formula (7) are formed when $Y^1$, $Y^2$ and $Y^3$ are selected from alkyl, carbocyclic heterocyclic groups, wherein the carbocyclic and heterocyclic groups can be aromatic and non-aromatic in nature.

In the third aspect of the invention, the inventive further layer located between the cathode and the light-emitting layer contains (a) 10-volume % or more of a carbocyclic fused ring aromatic compound and (b) a cyclometallated complex represented by Formula (4') wherein M represents a Group IA, IIA, IIIA and IIB element of the Periodic Table, and wherein the cyclometallated complex does not include the 8-hydroxyquinolate ligand. Useful embodiments of the second aspect of the invention include those complexes of Formula (4') wherein M represents a metal selected from the alkali or alkaline earth elements. Particularly useful embodiments of this aspect of the invention are when M is $Li^+$.

A particularly useful embodiment of this aspect of the invention is when the further layer comprises more than 10-volume % of the carbocyclic fused ring aromatic compound. In one desirable embodiment, the carbocyclic compound is a tetracene compound, such as for example rubrene, or an anthracene compound. Particularly useful carbocyclic fused ring aromatic compounds useful for the third aspect of the invention can be selected from Formulae (1), (2) and (3).

Particularly useful examples of cyclometallated complexes that satisfy the requirements of Formula (4') are found in examples MC-20, MC-28, MC-29 and MC-30. It should be noted that the cyclometallated compounds are not restricted to these examples but can be any examples that fulfill the requirements of Formula (4') and demonstrate the advantages of the invention.

In the fourth aspect of the invention, the inventive further layer located between the cathode and the light-emitting layer contains a single cyclometallated complex represented by Formula (4'), wherein M represents a Group IA, IIA, IIIA and IIB element of the Periodic Table, and wherein the cyclometallated complex does not include the 8-hydroxyquinolate ligand. Useful embodiments of the fourth aspect of the invention include those complexes of Formula (4') wherein M represents a metal selected from the alkali or alkaline earth elements. Additional useful cyclometallated complexes for embodiments of this aspect of the invention are formed when M in Formula (4'), is $Li^+$. Specific examples of the cyclometallated complexes that satisfy the requirements of Formula (4') are found in examples MC-20, MC-28, MC-29 and MC-30.

OLED devices with the single cyclometallated complex represented by Formula (4') in the further layer, and up to 10-volume % of at least one anthracene host compound of Formula (3) in the light emitting layer are particularly useful devices of this aspect of the invention. Useful anthracene host compounds of Formula (3) for the light-emitting layer are found in examples Cpd-8, Cpd-9, Cpd-10, Cpd-12 and Cpd-13.

In the fabrication of examples of OLED devices falling under the fourth aspect of the invention, independent selection can be made from compounds of Formulae (4') and (3) for the further, and light emitting layers of the devices, respectively.

It should be noted that the cyclometallated compounds and the anthracene hosts are not restricted to these examples for this aspect of the invention, but can be any examples that fulfill the requirements of Formulae (4') and (3) while demonstrating the advantages of the invention.

In the fifth aspect of the invention, the OLED device comprises a further layer located between the cathode and the light-emitting layer and contains (a) 10-volume % or more of a carbocyclic fused ring aromatic compound, and (b) at least one salt or complex constituting a Group IA, IIA, IIIA and IIB element of the Periodic Table. Preferred salts or complexes for this aspect of the invention are composed of alkali metal or alkaline earth metals. The device also contains an additional layer located between the anode and the light-emitting layer and said additional layer contains a compound of Formula (8).

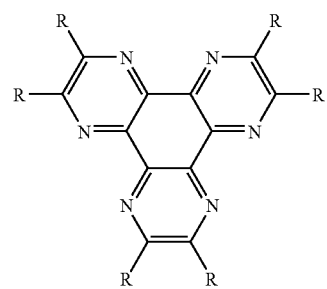

(8)

In Formula (8), R independently represents hydrogen or an independently selected substituent, at least one R represents an electron-withdrawing substituent having a Hammett's sigma para value of at least 0.3.

For an explanation of Hammett sigma values and a listing of the values for various substituents see C. Hansch, A. Leo, D. Hoekman; *Exploring QSAR: Hydrophobic, Electronic, and Steric Constants. American Chemical Society*: Washington, D.C. 1995. Also, C. Hansch, A. Leo; *Exploring QSAR: Fundamentals and Applications in Chemistry and Biology. American Chemical Society*: Washington, D.C. 1995.

In one desirable embodiment, the carbocyclic compound in the further layer is a tetracene compound, such as for example rubrene, or an anthracene compound. Particularly useful carbocyclic fused ring aromatic compounds useful for the fifth aspect of the invention can be selected from Formulae (1), (2) and (3) and can be present in the further layer in greater than 10-volume % of the layer. Useful salts and complexes of alkali and alkaline earth metals for the current aspect of the invention are those described in the present application with the complexes based on Formulae (4), (4'), (5), (6) and (7).

In one embodiment of the fifth aspect of the invention, each R of Formula (8) is independently selected from the group consisting of hydrogen, $C_1$ to $C_{12}$ hydrocarbon, halogen, alkoxy, arylamine, ester, amide, aromatic carbocyclic, aromatic heterocyclic, nitro, nitrile, sulfonyl, sulfoxide, sulfonamide, sulfonate, and trifluoromethyl groups. Particularly useful R groups are independently selected from the group consisting of nitrile, nitro, ester, and amide. Additional useful embodiments of this aspect of the invention are realized when the additional layer is located adjacent to a hole-transporting layer. Specific compounds for use in the additional layer are as follows:

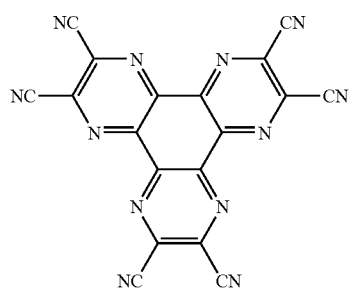

Dpq-1

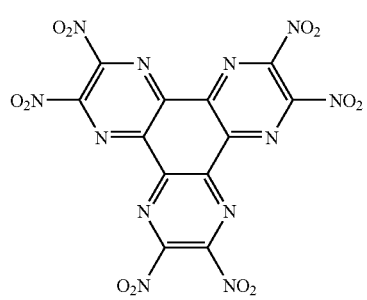

Dpq-2

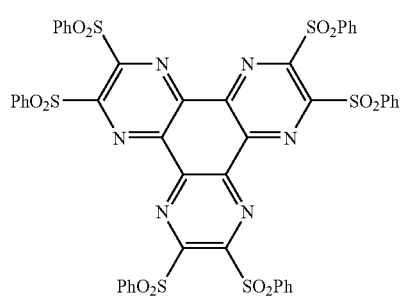

Dpq-3

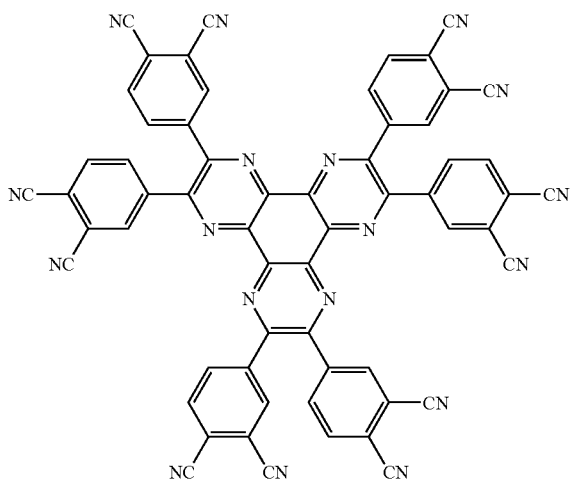

Dpq-4

In the sixth aspect of the invention, the OLED device of the invention comprises a cathode, a light emitting layer and an anode, in that order, and comprising (i) in the light-emitting layer at least one light emitting compound selected from amine containing monostyryl, amine containing distyryl, amine containing tristyryl and amine containing tetrastyryl compounds and (ii) a further layer located between the cathode and the light emitting layer, containing (a) 10-volume % or more of a carbocyclic fused ring aromatic compound, and (b) at least one salt or complex of a Group IA, IIA, IIIA and IIB element of the Periodic Table. Preferred salts or complexes for this aspect of the invention are composed of alkali metal or alkaline earth metals.

Formula (9) represents useful embodiments of the mono-, di-, tri- and tetrastyryl compounds of this aspect of the invention for use in the light-emitting layer

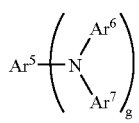

(9)

In Formula (9) $Ar^5$ $Ar^6$, and $Ar^7$ each represent independently selected substituted or unsubstituted aromatic carbocyclic groups containing 6 to 40 carbon atoms, wherein at least one of $Ar^5$ $Ar^6$ and $Ar^7$ contains a styryl group. The number of styryl groups is 1 to 4 and g is an integer selected from 1-4.

Formula (10) represents yet other useful embodiments of the mono, di-, tri- and tetrastyryl compounds of this aspect of the invention for use in the light-emitting layer

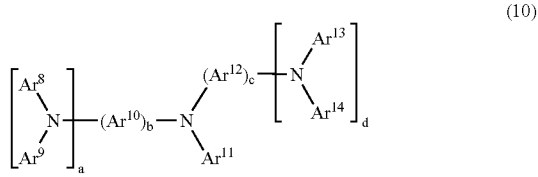

(10)

In Formula (10) $Ar^8$, $Ar^9$, $Ar^{11}$, $Ar^{13}$ and $Ar^{14}$ each independently represent a substituted or unsubstituted monovalent group having 6 to 40 carbon atoms and $Ar^{10}$ and $Ar^{12}$ each independently represent a substituted or unsubstituted divalent group having 6 to 40 carbon atoms. At least one of the groups represented by $Ar^8$ to $Ar^{12}$ contains a styryl group. In Formula (10), a and d each represent an integer of 0-2; b and c each represent an integer of 1-2; and the number of styryl groups is 1 to 4.

For the purposes of this invention, the term styryl is the radical PhCH=CH—, derived from the chemical styrene. A definition of styryl, also referred to as 2-phenylethenyl, cinnamenyl and styrylene, can be found in *Grant & Hackh's Chemical Dictionary*, Fifth Edition, McGraw-Hill Book Company, pages 557-558. Also, for the further purposes of this invention, the styryl group useful in the invention can be further substituted.

A useful embodiment of this aspect of the invention is when the further layer comprises more than 10-volume % of the carbocyclic fused ring aromatic compound. In one desirable embodiment, the carbocyclic compound is a tetracene compound, such as for example rubrene, or an anthracene compound. Particularly useful carbocyclic fused ring aromatic compounds useful for the third aspect of the invention can be selected from Formulae (1), (2) and (3).

Useful embodiments of the sixth aspect of the invention wherein the further layer includes complexes of Formulae (4), (4'), (5), (6) and (7) wherein M represents a metal selected from the alkali or alkaline earth elements. Particularly useful embodiments of this aspect of the invention are when M in Formulae (4), (4'), (5) and (6) is $Li^+$. A useful metal complex is formed when M in Formula (6) is $Li^+$ to give lithium acetylacetonate and it derivatives, represented by Formula (7).

Specific examples of salts or complexes that satisfy the requirements of Formulae (4), (4'), (5), (6) and (7) are found in examples MC-20, MC-28, MC-29 and MC-30. It should be noted that the salt or complex compounds are not restricted to these examples but can be any example that fulfills the requirements of Formulae (4), (4'), (5), (6) and (7) and demonstrates the advantages of the invention.

The architecture of the OLED devices of all aspects of the invention can be constructed, by the careful selection of hosts and dopants (also known as light emitting materials), so that the devices can be made to emit blue, green, red or white light. Additionally, in all of the aforementioned aspects, the layer or further layer of the invention may be light-emitting, in which case the device includes two light-emitting layers, for example such as in an EL device that produces white light. In another embodiment the layer or further layer does not emit light. By this it is meant that the layer does not emit substantial amounts of light. Suitably, this layer emits less than 5%, or even less than 1% of the light and desirably it emits no light at all.

In one embodiment of all aspects of the invention, the layer or further layer is located adjacent to the cathode and functions as an electron-transporting layer. In another embodiment of all aspects of the invention, the layer or further layer is located adjacent to an electron-injecting layer, which is adjacent to the cathode. Electron-injecting layers include those taught in U.S. Pat. Nos. 5,608,287; 5,776,622; 5,776,623; 6,137,223; and 6,140,763; the disclosures of which are incorporated herein by reference. An electron-injecting layer generally consists of an electron-injecting material having a work function less than 4.2 eV or the salt of a metal having a work function less than 4.2 eV. A thin-film containing low work-function alkaline metals or alkaline earth metals, such as Li, Na, K, Rb, Cs, Ca, Mg, Sr and Ba can be employed. In addition, an organic material doped with these low work-function metals can also be used effectively as the electron-injecting layer. Examples are Li- or Cs-doped Alq. In one suitable embodiment, the electron-injecting layer includes alkali and alkaline earth metal inorganic salts, including their oxides. Also included are alkali and alkaline earth metal organic salts and complexes. In fact, any metal salt or compound which can be reduced in the device to liberate its free metal, either as a free entity or a transient species, are useful in the electron-injecting layer. Examples include, lithium fluoride (LiF), sodium fluoride (NaF), cesium fluoride (CsF), lithium oxide ($Li_2O$), lithium acetylacetonate (Liacac), lithium benzoate, potassium benzoate, lithium acetate and lithium formate. In practice, the electron-injecting layer is often a thin interfacial layer deposited to a suitable thickness in a range of 0.1-10.0 nm, but more typically in the range of 0.1-5.0 nm. An interfacial electron-injecting layer in this thickness range will provide effective electron injection into the layer or further layer of the invention. Optionally, the electron injecting layer may be omitted from the invention.

Unless stated otherwise, when the carbocyclic aromatic fused ring compound is present in the layer or further layer of the different aspects of the invention, it can comprise 10% or more of the layer by volume. In one embodiment the carbocyclic compound comprises 20%, 40%, 50%, or even 60% or more of the layer. In another common embodiment of the invention, the compound comprises less than 90%, 80%, 70% or even below 60% or less of the layer. In one suitable common embodiment, the compound comprises between 15 and 95%, or often between 25% and 90%, and commonly between 50 and 80% of the inventive layer by volume. Examples of useful carbocyclic aromatic fused ring compounds for the invention are as follows;

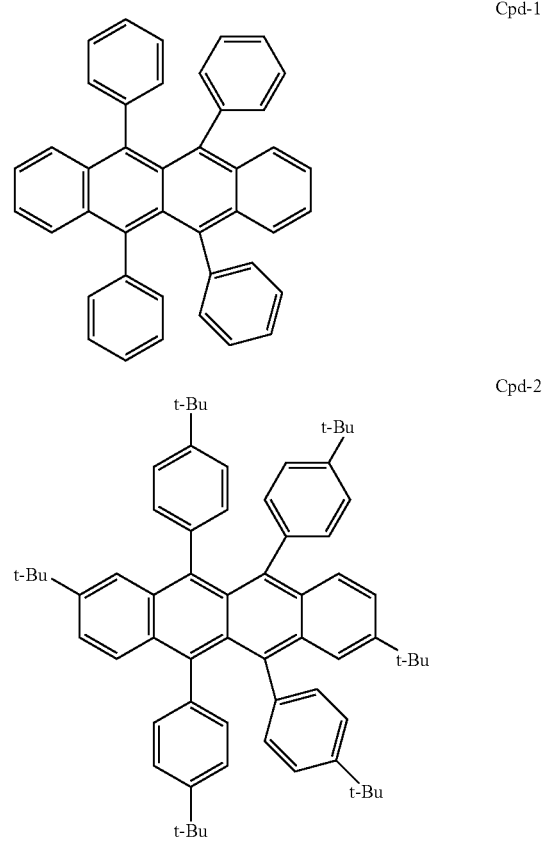

Cpd-1

Cpd-2

Cpd-3
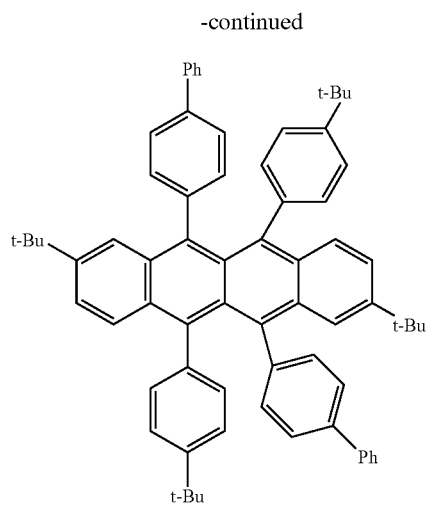
Cpd-6
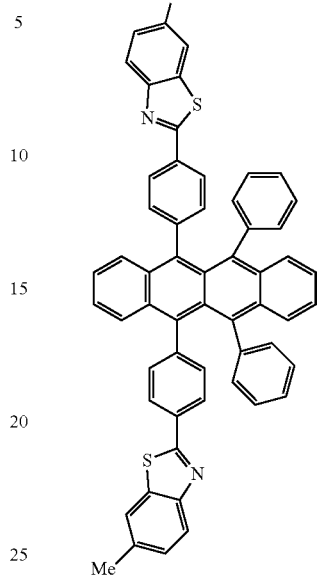
Cpd-4
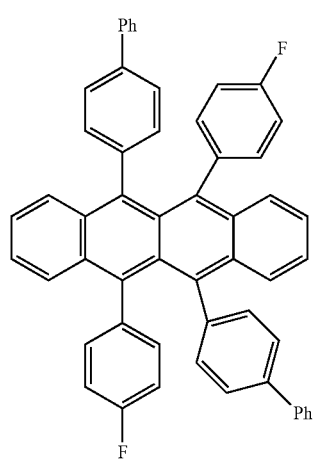
Cpd-5
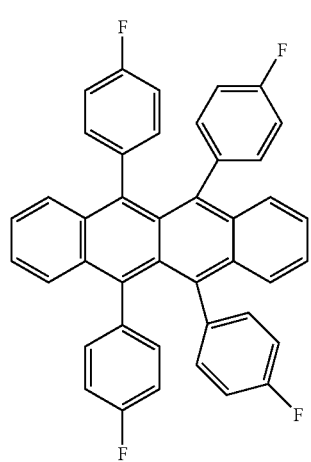
Cpd-7
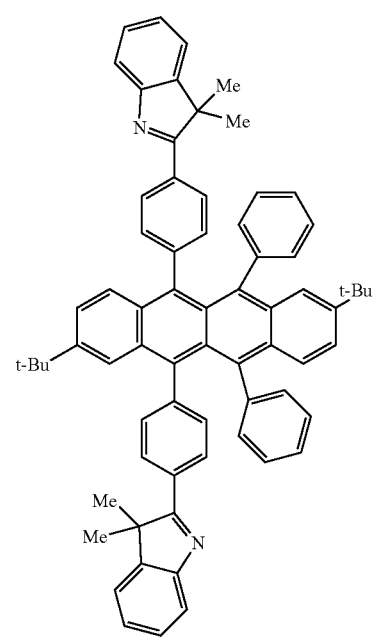

-continued
Cpd-8
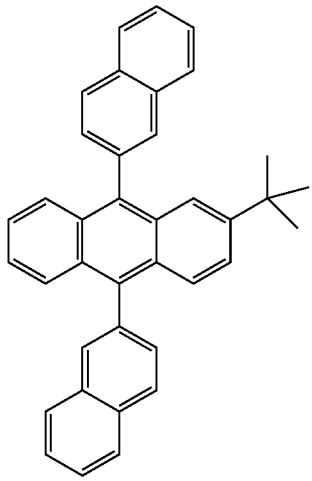
Cpd-9
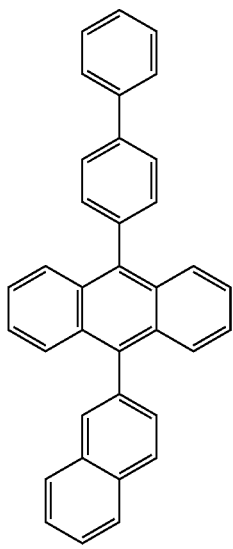
Cpd-10
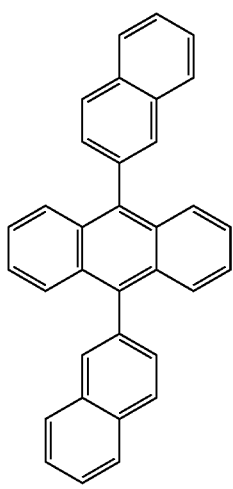
Cpd-11
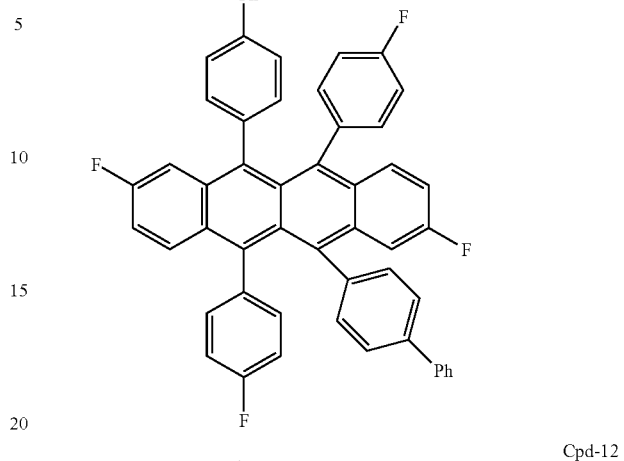
Cpd-12
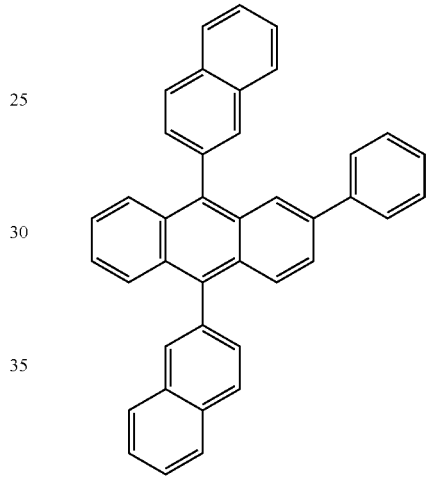
Cpd-13
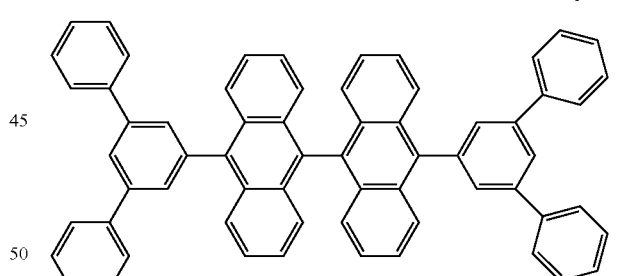
Cpd-14
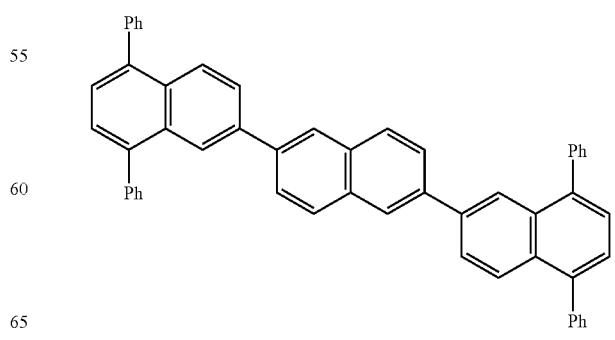

Cpd-15
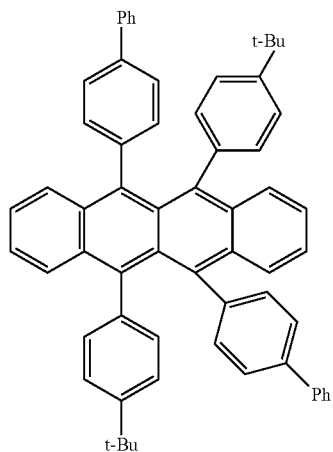
Cpd-18
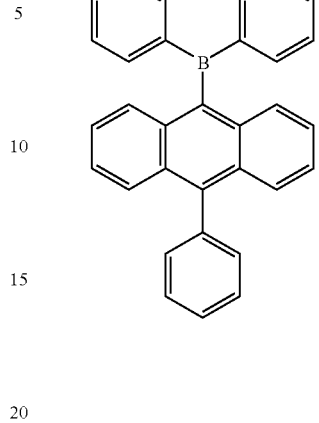
Cpd-16
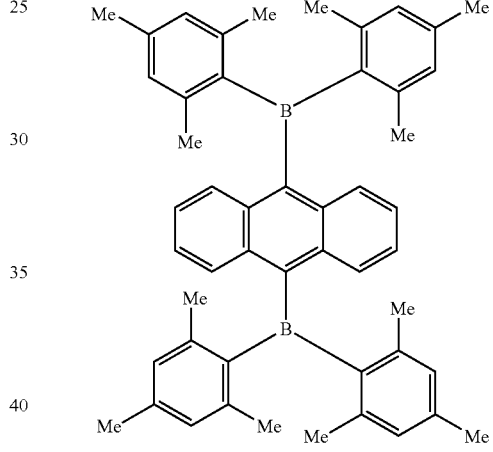
Cpd-19
Cpd-17
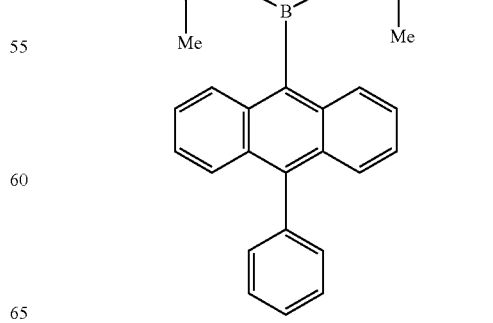
Cpd-20

Cpd-21

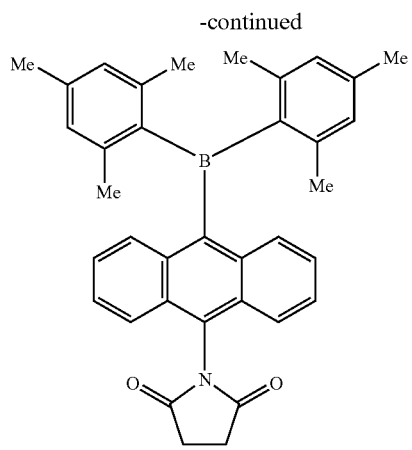

When the carbocyclic aromatic fused ring compound is present in the inventive layer or further layer of the different aspects of the invention, the layer also includes at least one salt or complex that includes an ion selected from Group IA, IIA, IIIA or IIB elements of the Periodic Table, but preferably the ion of an alkali or alkaline earth metal, or a salt of a metal having a work function less than 4.2 eV, wherein the metal has a charge of +1 or +2. Further common embodiments of the invention include those in which there are more than one salt or complex, or a mixture of a salt and a complex in the layer. The salt can be any organic or inorganic salt or oxide of an alkali or alkaline earth metal that can be reduced to the free metal, either as a free entity or a transient species in the device. The complex or salt can be present in the balance amount of the carbocyclic aromatic fused ring compound. Examples include, but are not limited to, the alkali and alkaline earth halides, including lithium fluoride (LiF), sodium fluoride is (NaF), cesium fluoride (CsF), calcium fluoride (CaF$_2$) lithium oxide (Li$_2$O), lithium acetylacetonate (Liacac), lithium benzoate, potassium benzoate, lithium acetate and lithium formate. Examples MC-1-MC-30 are further examples of useful salts or complexes for the invention.

MC-1

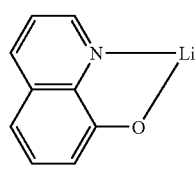

MC-2

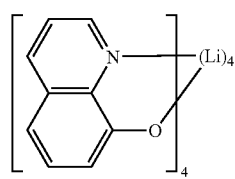

MC-3

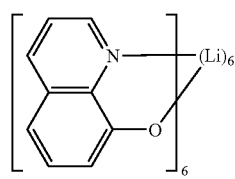

MC-4

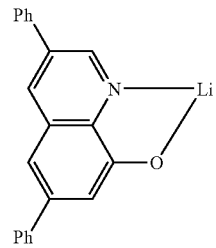

MC-5

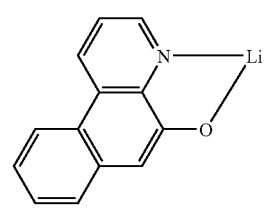

MC-6

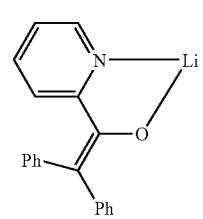

MC-7

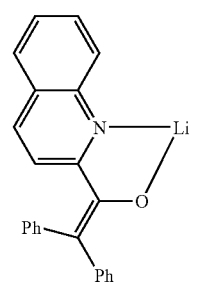

MC-8

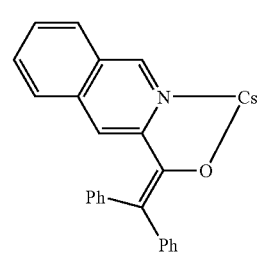

MC-9

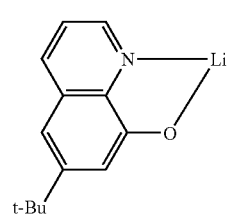

MC-10

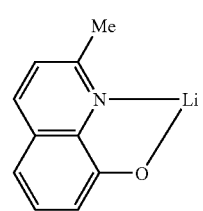

-continued
MC-11 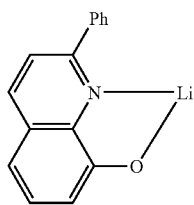
MC-12 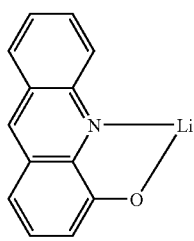
MC-13 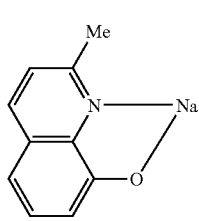
MC-14 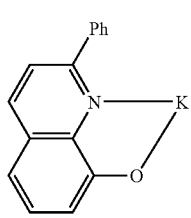
MC-15 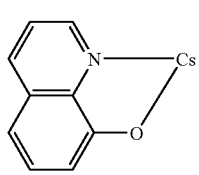
MC-16 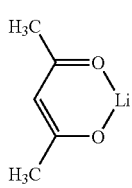
MC-17 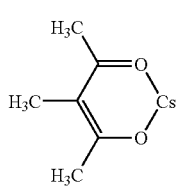
-continued
MC-18 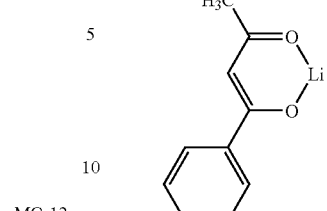
MC-19 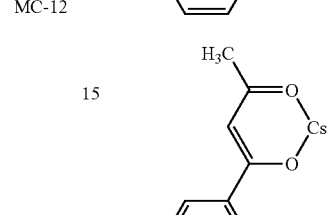
MC-20 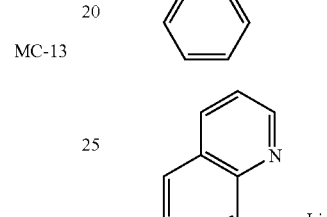
MC-21 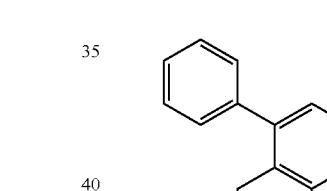
MC-22 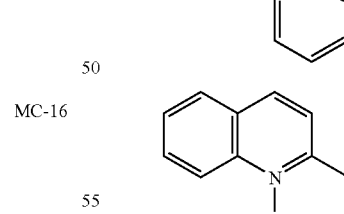
MC-23 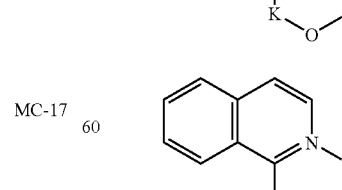

-continued

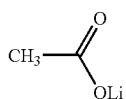 MC-24

Li₂O MC-25

LiF MC-26

CsF MC-27

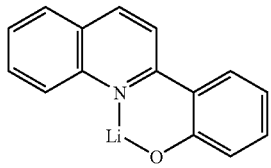 MC-28

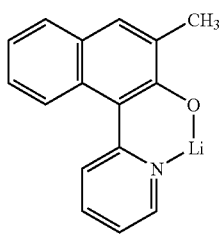 MC-29

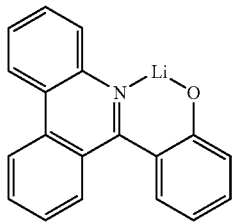 MC-30

Desirably, the metal complex is present in the layer at a level of at least 1%, more commonly at a level of 5% or more, and frequently at a level of 10% or even 20% or greater by volume. In one embodiment, the complex is present at a level of 20-60% of the layer by volume. Overall, the complex or salt can be present in the balance amount of the carbocyclic aromatic fused ring compound.

In another aspect of the invention, the inventive layer also includes an elemental metal having a work function less than 4.2 eV. The definition of work function can be found in *CRC Handbook of Chemistry and Physics,* 70th Edition, 1989-1990, CRC Press Inc., page F-132 and a list of the work functions for various metals can be found on pages E-93 and E-94. Typical examples of such metals include Li, Na, K, Be, Mg, Ca, Sr, Ba, Y, La, Sm, Gd, Yb. In one desirable embodiment the metal is Li.

When included in the layer, the elemental metal is often present in the amount of from 0.1% to 15%, commonly in the amount of 0.1% to 10%, and often in the amount of 1 to 5% by volume of the total material in the layer.

In all described aspects of the invention, the additional layer located between the anode and the light-emitting layer and which contains a compound of Formula (8) in the fifth aspect of the invention, can also be incorporated as an additional layer between the anode and the light emitting layer of the first, second, third, fourth, fifth and sixth aspects of the invention. Compounds Dpq-1, Dpq-2, Dpq-3 and Dpq-4 are specific examples useful for the additional layer. Additional useful embodiments of the first, second, third, fourth, fifth, and sixth aspects of the invention are realized when the additional layer is located adjacent to a hole-transporting layer.

In all described aspects of the invention, it should be understood that the inventive layer, further layer and additional layer applies to OLED devices that emit light by both fluorescence and phosphorescence. In other words, the OLED devices can be triple or singlet in nature. The advantages of the invention can be realized with both fluorescent and phosphorescent devices.

The thickness of the inventive layer may be between 0.5 and 200 nm, suitably between 2 and 100 nm, and desirably between 5 and 50 nm.

Unless otherwise specifically stated, use of the term "substituted" or "substituent" means any group or atom other than hydrogen. Additionally, when the term "group" is used, it means that when a substituent group contains a substitutable hydrogen, it is also intended to encompass not only the substituent's unsubstituted form, but also its form further substituted with any substituent group or groups as herein mentioned, so long as the substituent does not destroy properties necessary for device utility. Suitably, a substituent group may be halogen or may be bonded to the remainder of the molecule by an atom of carbon, silicon, oxygen, nitrogen, phosphorous, sulfur, selenium, or boron. The substituent may be, for example, halogen, such as chloro, bromo or fluoro; nitro; hydroxyl; cyano; carboxyl; or groups which may be further substituted, such as alkyl, including straight or branched chain or cyclic alkyl, such as methyl, trifluoromethyl, ethyl, t-butyl, 3-(2,4-di-t-pentylphenoxy)propyl, and tetradecyl; alkenyl, such as ethylene, 2-butene; alkoxy, such as methoxy, ethoxy, propoxy, butoxy, 2-methoxyethoxy, sec-butoxy, hexyloxy, 2-ethylhexyloxy, tetradecyloxy, 2-(2,4-di-t-pentylphenoxy)ethoxy, and 2-dodecyloxyethoxy; aryl such as phenyl, 4-t-butylphenyl, 2,4,6-trimethylphenyl, naphthyl; aryloxy, such as phenoxy, 2-methylphenoxy, alpha- or beta-naphthyloxy, and 4-tolyloxy; carbonamido, such as acetamido, benzamido, butyramido, tetradecanamido, alpha-(2,4-di-t-pentyl-phenoxy)acetamido, alpha-(2,4-di-t-pentylphenoxy)butyramido, alpha-(3-pentadecylphenoxy)-hexanamido, alpha-(4-hydroxy-3-t-butylphenoxy)-tetradecanamido, 2-oxo-pyrrolidin-1-yl, 2-oxo-5-tetradecylpyrrolin-1-yl, N-methyltetradecanamido, N-succinimido, N-phthalimido, 2,5-dioxo-1-oxazolidinyl, 3-dodecyl-2,5-dioxo-1-imidazolyl, and N-acetyl-N-dodecylamino, ethoxycarbonylamino, phenoxycarbonylamino, benzyloxycarbonylamino, hexadecyloxycarbonylamino, 2,4-di-t-butylphenoxycarbonylamino, phenylcarbonylamino, 2,5-(di-t-pentylphenyl)carbonylamino, p-dodecyl-phenylcarbonylamino, p-tolylcarbonylamino, N-methylureido, N,N-dimethylureido, N-methyl-N-dodecylureido, N-hexadecylureido, N,N-dioctadecylureido, N,N-dioctyl-N'-ethylureido, N-phenylureido, N,N-diphenylureido, N-phenyl-N-p-tolylureido, N-(m-hexadecylphenyl)ureido, N,N-(2,5-di-t-pentylphenyl)-N'-ethylureido, and t-butylcarbonamido; sulfonamido, such as methylsulfonamido, benzenesulfonamido, p-tolylsulfonamido, p-dodecylbenzenesulfonamido, N-methyltetradecylsulfonamido, N,N-dipropylsulfamoylamino, and hexadecylsulfonamido; sulfamoyl, such as N-methylsulfamoyl, N-ethylsulfamoyl, N,N-dipropylsulfamoyl, N-hexadecylsulfamoyl, N,N-dimethylsulfamoyl, N-[3-(dodecyloxy)propyl]sulfamoyl, N-[4-(2,4-di-t-pentylphenoxy)butyl]sulfamoyl, N-methyl-N-tetradecylsulfamoyl, and N-dodecylsulfamoyl; carbamoyl, such as N-methylcarbamoyl, N,N-dibutylcarbamoyl, N-octadecylcarbamoyl, N-[4-(2,4-di-t-pentylphenoxy)butyl]carbamoyl, N-methyl-N-tetradecylcarbamoyl, and N,N-dioctylcarbamoyl; acyl, such as acetyl, (2,4-di-t-amylphenoxy)acetyl, phenoxycarbonyl, p-dodecyloxyphenoxycarbonyl methoxycarbonyl, butoxycarbonyl, tetradecyloxycarbonyl, ethoxycarbonyl, benzyloxycarbonyl, 3-pentadecyloxycarbonyl, and dodecyloxycarbonyl; sulfonyl, such as methoxysulfonyl, octyloxysulfonyl, tetradecyloxysulfonyl, 2-ethylhexyloxysulfonyl, phenoxysulfonyl, 2,4-di-t-pentylphenoxysulfonyl, methylsulfonyl, octylsulfonyl, 2-ethylhexylsulfonyl, dodecylsulfonyl, hexadecylsulfonyl, phenylsulfonyl, 4-nonylphenylsulfonyl, and p-tolylsulfonyl; sulfonyloxy, such as dodecylsulfonyloxy, and hexadecylsulfonyloxy; sulfinyl, such as methylsulfinyl, octylsulfinyl, 2-ethylhexylsulfinyl, dodecylsulfinyl, hexadecylsulfinyl, phenylsulfinyl, 4-nonylphenylsulfinyl, and p-tolylsulfinyl; thio, such as ethylthio, octylthio, benzylthio, tetradecylthio, 2-(2,4-di-t-pentylphenoxy)ethylthio, phenylthio, 2-butoxy-5-t-octylphenylthio, and p-tolylthio; acyloxy, such as acetyloxy, benzoyloxy, octadecanoyloxy, p-dodecylamidobenzoyloxy, N-phenylcarbamoyloxy, N-ethylcarbamoyloxy, and cyclohexylcarbonyloxy; amine, such as phenylanilino, 2-chloroanilino, diethylamine, dodecylamine; imino, such as 1 (N-phenylimido)ethyl, N,N-succinimido or 3-benzylhydantoinyl; phosphate, such as dimethylphosphate and ethylbutylphosphate; phosphite, such as diethyl and dihexylphosphite; a heterocyclic group, a heterocyclic oxy group or a heterocyclic thio group, each of which may be substituted and which contain a 3 to 7 membered heterocyclic ring composed of carbon atoms and at least one hetero atom selected from the group consisting of oxygen, nitrogen, sulfur, phosphorous, or boron. Such as 2-furyl, 2-thienyl, 2-benzimidazolyloxy or 2-benzothiazolyl; quaternary ammonium, such as triethylammonium; quaternary phosphonium, such as triphenylphosphonium; and silyloxy, such as trimethylsilyloxy.

If desired, the substituents may themselves be further substituted one or more times with the described substituent groups. The particular substituents used may be selected by those skilled in the art to attain desirable properties for a specific application and can include, for example, electron-withdrawing groups, electron-donating groups, and steric groups. When a molecule may have two or more substituents, the substituents may be joined together to form a ring such as a fused ring unless otherwise provided. Generally, the above groups and substituents thereof may include those having up to 48 carbon atoms, typically 1 to 36 carbon atoms and usually less than 24 carbon atoms, but greater numbers are possible depending on the particular substituents selected.

General Device Architecture

The present invention can be employed in many EL device configurations using small molecule materials, oligomeric materials, polymeric materials, or combinations thereof. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

There are numerous configurations of the organic layers wherein the present invention can be successfully practiced. The essential requirements of an OLED are an anode, a cathode, and an organic light-emitting layer located between the anode and cathode. Additional layers may be employed as more fully described hereafter.

A typical structure according to the present invention and especially useful for a small molecule device, is shown in the Figure and is comprised of a substrate 101, an anode 103, a hole-injecting layer 105, a hole-transporting layer 107, a light-emitting layer 109, an electron-transporting layer 111, an electron injecting layer 112, and a cathode 113. These layers are described in detail below. Note that the substrate 101 may alternatively be located adjacent to the cathode 113, or the substrate 101 may actually constitute the anode 103 or cathode 113. The organic layers between the anode 103 and cathode 113 are conveniently referred to as the organic EL element. Also, the total combined thickness of the organic layers is desirably less than 500 nm. If the device includes phosphorescent material, a hole-blocking layer, located between the light-emitting layer and the electron-transporting layer, may be present.

The anode 103 and cathode 113 of the OLED are connected to a voltage/current source 150 through electrical conductors 160. The OLED is operated by applying a potential between the anode 103 and cathode 113 such that the anode 103 is at a more positive potential than the cathode 113. Holes are injected into the organic EL element from the anode 103 and electrons are injected into the organic EL element at the cathode 113. Enhanced device stability can sometimes be achieved when the OLED is operated in an AC mode where, for some time period in the AC cycle, the potential bias is reversed and no current flows. An example of an AC driven OLED is described in U.S. Pat. No. 5,552,678.

Substrate

The OLED device of this invention is typically provided over a supporting substrate 101 where either the cathode 113 or anode 103 can be in contact with the substrate. The electrode in contact with the substrate 101 is conveniently referred to as the bottom electrode. Conventionally, the bottom electrode is the anode 103, but this invention is not limited to that configuration. The substrate 101 can either be light transmissive or opaque, depending on the intended direction of light emission. The light transmissive property is desirable for viewing the EL emission through the substrate 101. Transparent glass or plastic is commonly employed in such cases. The substrate 101 can be a complex structure comprising multiple layers of materials. This is typically the case for active matrix substrates wherein TFTs are provided below the OLED layers. It is still necessary that the substrate 101, at least in the emissive pixelated areas, be comprised of largely transparent materials such as glass or polymers. For applications where the EL emission is viewed through the top electrode, the transmissive characteristic of the bottom support is immaterial, and therefore the substrate can be light transmissive, light absorbing or light reflective. Substrates for use in this case include, but are not limited to, glass, plastic, semiconductor materials such as silicon, ceramics, and circuit board materials. Again, the substrate 101 can be a complex structure comprising multiple layers of materials such as found in active matrix TFT designs. It is necessary to provide in these device configurations a light-transparent top electrode.

Anode

When the desired electroluminescent light emission (EL) is viewed through the anode, the anode 103 should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode 103. For applications where EL emission is viewed only through the cathode 113, the transmissive characteristics of the anode 103 are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize short circuits or enhance reflectivity.

Cathode

When light emission is viewed solely through the anode 103, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One useful cathode material is comprised of a Mg:Ag alloy wherein the percentage of silver is in the range of 1 to 20%, as described in U.S. Pat. No. 4,885,221. Another suitable class of cathode materials includes bilayers comprising the cathode and a thin electron-injection layer (EIL) in contact with an organic layer (e.g., an electron transporting layer (ETL)), the cathode being capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. An ETL material doped with an alkali metal, for example, Li-doped Alq, is another example of a useful EIL. Other useful cathode material sets include, but are not limited to, those disclosed in U.S. Pat. Nos. 5,059,861, 5,059,862, and 6,140,763.

When light emission is viewed through the cathode, the cathode 113 must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608,287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, U.S. Pat. No. 6,278,236, and U.S. Pat. No. 6,284,3936. Cathode materials are typically deposited by any suitable method such as evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Hole-Injecting Layer (HIL)

Depending on the aspect of the invention, the device may include a HIL of the invention or an HIL as known in the art, or both. A hole-injecting layer 105 may be provided between anode 103 and hole-transporting layer 107. The hole-injecting layer can serve to improve the film formation property of subsequent organic layers and to facilitate injection of holes into the hole-transporting layer 107. Suitable materials for use in the hole-injecting layer 105 include, but are not limited to, porphyrinic compounds as described in U.S. Pat. No. 4,720,432, plasma-deposited fluorocarbon polymers as described in U.S. Pat. No. 6,208,075, and some aromatic amines, for example, MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1. A hole-injection layer is conveniently used in the present invention, and is desirably a plasma-deposited fluorocarbon polymer. The thickness of a hole-injection layer containing a plasma-deposited fluorocarbon polymer can be in the range of 0.2 nm to 15 nm and suitably in the range of 0.3 to 1.5 nm.

Hole-Transporting Layer (HTL)

While not always necessary, it is often useful to include a hole-transporting layer in an OLED device. The hole-transporting layer 107 of the organic EL device contains at least one hole-transporting compound such as an aromatic tertiary amine. An aromatic tertiary amine is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. No. 3,567,450 and U.S. Pat. No. 3,658,520.

A more preferred class of aromatic tertiary amines is those which include at least two aromatic tertiary amine moieties as described in U.S. Pat. No. 4,720,432 and U.S. Pat. No. 5,061,569. Such compounds include those represented by structural formula (A).

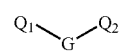

A wherein $Q_1$ and $Q_2$ are independently selected aromatic tertiary amine moieties and G is a linking group such as an arylene, cycloalkylene, or alkylene group of a carbon to carbon bond. In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

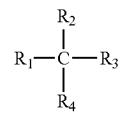

B where $R_1$ and $R_2$ each independently represents a hydrogen atom, an aryl group, or an alkyl group or $R_1$ and $R_2$ together represent the atoms completing a cycloalkyl group; and $R_3$ and $R_4$ each independently represents an aryl group, which is in turn substituted with a diaryl substituted amino group, as indicated by structural formula (C):

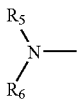

wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines is the tetraaryldiamines. Desirable tetraaryldiamines include two diarylamino groups, such as indicated by formula (C), linked through an arylene group. Useful tetraaryldiamines include those represented by formula (D).

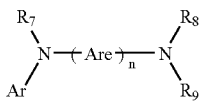

wherein
each Are is an independently selected arylene group, such as a phenylene or anthracene moiety,
n is an integer of from 1 to 4, and
Ar, $R_7$, $R_8$, and $R_9$ are independently selected aryl groups.
In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halide such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single tertiary amine compound or a mixture of such compounds. Specifically, one may employ a triarylamine, such as a triarylamine satisfying the formula (B), in combination with a tetraaryldiamine, such as indicated by formula (D). Illustrative of useful aromatic tertiary amines are the following:
1,1-Bis(4-di-p-tolylaminophenyl)cyclohexane (TAPC)
1,1-Bis(4-di-p-tolylaminophenyl)-4-methylcyclohexane
1,1-Bis(4-di-p-tolylaminophenyl)-4-phenylcyclohexane
1,1-Bis(4-di-p-tolylaminophenyl)-3-phenylpropane (TAPPP)
N,N,N',N'-tetraphenyl-4,4'''-diamino-1,1':4',1'':4'',1'''-quaterphenyl
Bis(4-dimethylamino-2-methylphenyl)phenylmethane
1,4-bis[2-[4-[N,N-di(p-toly)amino]phenyl]vinyl]benzene (BDTAPVB)
N,N,N',N'-Tetra-p-tolyl-4,4'-diaminobiphenyl (TTB)
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl (NPB)
4,4'-Bis[N-(1-naphthyl)-N-(2-naphthyl)amino]biphenyl (TNB)
4,4'-Bis[N-(1-naphthyl)-N-phenylamino]-p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4'-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenyl amino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4''-diamino-p-terphenyl
4,4'-Bis {N-phenyl-N-[4-(1-naphthyl)-phenyl]amino}biphenyl
2,6-Bis[N,N-di(2-naphthyl)amino]fluorene
4,4',4''-tris[(3-methylphenyl)phenylamino]triphenylamine (MTDATA)
4,4'-Bis[N-(3-methylphenyl)-N-phenylamino]biphenyl (TPD)

Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS. It is also possible for the hole-transporting layer to comprise two or more sublayers of differing compositions, the composition of each sublayer being as described above. The thickness of the hole-transporting layer can be between 10 and about 500 nm and suitably between 50 and 300 nm.

Light-Emitting Layer (LEL)

As more fully described in U.S. Pat. Nos. 4,769,292 and 5,935,721, the light-emitting layer (LEL) of the organic EL element includes a luminescent material where electroluminescence is produced as a result of electron-hole pair recombination. The light-emitting layer can be comprised of a single material, but more commonly consists of a host material doped with a guest emitting material or materials where light emission comes primarily from the emitting materials and can be of any color. The host materials in the light-emitting layer can be an electron-transporting material, as defined below, a hole-transporting material, as defined above, or another material or combination of materials that support hole-electron recombination. Fluorescent emitting materials are typically incorporated at 0.01 to 10% by weight of the host material.

The host and emitting materials can be small non-polymeric molecules or polymeric materials such as polyfluorenes and polyvinylarylenes (e.g., poly(p-phenylenevinylene), PPV). In the case of polymers, small-molecule emitting materials can be molecularly dispersed into a polymeric host, or the emitting materials can be added by copolymerizing a minor constituent into a host polymer. Host materials may be mixed together in order to improve film formation, electrical properties, light emission efficiency, operating lifetime, or manufacturability. The host may comprise a material that has good hole-transporting properties and a material that has good electron-transporting properties.

An important relationship for choosing a fluorescent material as a guest emitting material is a comparison of the excited singlet-state energies of the host and the fluorescent material. It is highly desirable that the excited singlet-state energy of the fluorescent material be lower than that of the host material. The excited singlet-state energy is defined as the difference in energy between the emitting singlet state and the ground state. For non-emissive hosts, the lowest excited state of the same electronic spin as the ground state is considered the emitting state.

Host and emitting materials known to be of use include, but are not limited to, those disclosed in U.S. Pat. No. 4,768,292, U.S. Pat. No. 5,141,671, U.S. Pat. No. 5,150,006, U.S. Pat. No. 5,151,629, U.S. Pat. No. 5,405,709, U.S. Pat. No. 5,484,922, U.S. Pat. No. 5,593,788, U.S. Pat. No. 5,645,948, U.S. Pat. No. 5,683,823, U.S. Pat. No. 5,755,999, U.S. Pat. No. 5,928,802, U.S. Pat. No. 5,935,720, U.S. Pat. No. 5,935,721, and U.S. Pat. No. 6,020,078.

Metal complexes of 8-hydroxyquinoline and similar derivatives, also known as metal-chelated oxinoid compounds (Formula E), constitute one class of useful host compounds capable of supporting electroluminescence, and are particularly suitable for light emission of wavelengths longer than 500 nm, e.g., green, yellow, orange, and red.

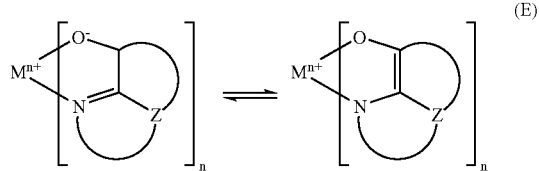

(E)

wherein

M represents a metal;

n is an integer of from 1 to 4; and

Z independently in each occurrence represents the atoms completing a nucleus having at least two fused aromatic rings.

From the foregoing it is apparent that the metal can be monovalent, divalent, trivalent, or tetravalent metal. The metal can, for example, be an alkali metal, such as lithium, sodium, or potassium; an alkaline earth metal, such as magnesium or calcium; a trivalent metal, such aluminum or gallium, or another metal such as zinc or zirconium. Generally any monovalent, divalent, trivalent, or tetravalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]

CO-2: Magnesium bisoxine [alias, bis(8-quinolinolato)magnesium(II)]

CO-3: Bis[benzo {f}-8-quinolinolato]zinc (II)

CO-4: Bis(2-methyl-8-quinolinolato)aluminum(III)-□-oxo-bis(2-methyl-8-quinolinolato) aluminum(III)

CO-5: Indium trisoxine [alias, tris(8-quinolinolato)indium]

CO-6: Aluminum tris(5-methyloxine) [alias, tris(5-methyl-8-quinolinolato) aluminum(II)]

CO-7: Lithium oxine [alias, (8-quinolinolato)lithium(I)]

CO-8: Gallium oxine [alias, tris(8-quinolinolato)gallium (III)]

CO-9: Zirconium oxine [alias, tetra(8-quinolinolato)zirconium(IV)]

Derivatives of 9,10-di-(2-naphthyl)anthracene (Formula F1) constitute one class of useful host materials capable of supporting electroluminescence, and are particularly suitable for light emission of wavelengths longer than 400 nm, e.g., blue, green, yellow, orange or red.

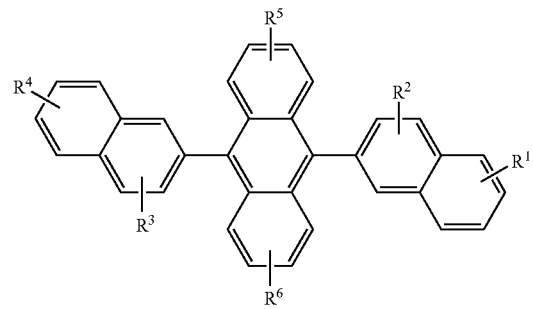

(F1)

wherein: $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl; pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Illustrative examples include 9,10-di-(2-naphthyl)anthracene and 2-t-butyl-9,10-di-(2-naphthyl)anthracene. Other anthracene derivatives can be useful as a host in the LEL, including derivatives of 9,10-bis[4-(2,2-diphenylethenyl)phenyl]anthracene.

The monoanthracene derivative of Formula (F2) is also a useful host material capable of supporting electroluminescence, and are particularly suitable for light emission of wavelengths longer than 400 nm, e.g., blue, green, yellow, orange or red. Anthracene derivatives of Formula (F3) are described in commonly assigned U.S. patent application Ser. No. 10/693,121 filed Oct. 24, 2003 by Lelia Cosimbescu et al., entitled "Electroluminescent Device With Anthracene Derivative Host", the disclosure of which is herein incorporated by reference.

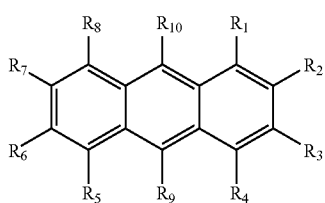

(F2)

wherein:

$R_1$-$R_8$ are H; and $R_9$ is a naphthyl group containing no fused rings with aliphatic carbon ring members; provided that $R_9$ and $R_{10}$ are not the same, and are free of amines and sulfur compounds. Suitably, $R_9$ is a substituted naphthyl group with one or more further fused rings such that it forms a fused aromatic ring system, including a phenanthryl, pyrenyl, fluoranthene, perylene, or substituted with one or more substituents including fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl substituted or unsubstituted in the para position; and $R_{10}$ is a biphenyl group having no fused rings with aliphatic carbon ring members. Suitably $R_{10}$ is a substituted biphenyl group, such that is forms a fused aromatic ring system including but not limited to a naphthyl, phenanthryl, perylene, or substituted with one or more substituents including fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl. Particularly useful is 9-(2-naphthyl)-10-(4-biphenyl)anthracene.

Another useful class of anthracene derivatives is represented by general formula (F3)

A1-L-A2     (F3)

wherein A 1 and A 2 each represent a substituted or unsubstituted monophenylanthryl group or a substituted or unsubstituted diphenylanthryl group and can be the same with or different from each other and L represents a single bond or a divalent linking group.

Another useful class of anthracene derivatives is represented by general formula (F4)

A3-An-A4     (F4)

wherein An represents a substituted or unsubstituted divalent anthracene residue group, A 3 and A 4 each represent a substituted or unsubstituted monovalent condensed aromatic ring group or a substituted or unsubstituted non-condensed ring aryl group having 6 or more carbon atoms and can be the same with or different from each other.

Asymmetric anthracene derivatives as disclosed in U.S. Pat. No. 6,465,115 and WO 2004/018587 are useful hosts and these compounds are represented by general formulas (F5) and (F6) shown below, alone or as a component in a mixture

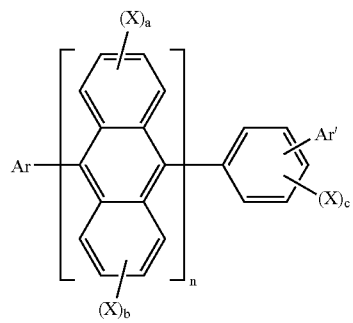

(F5)

wherein:

Ar is an (un)substituted condensed aromatic group of 10-50 nuclear carbon atoms;

Ar' is an (un)substituted aromatic group of 6-50 nuclear carbon atoms;

X is an (un)substituted aromatic group of 6-50 nuclear carbon atoms, (un)substituted aromatic heterocyclic group of 5-50 nuclear carbon atoms, (un)substituted alkyl group of 1-50 carbon atoms, (un)substituted alkoxy group of 1-50 carbon atoms, (un)substituted aralkyl group of 6-50 carbon atoms, (un)substituted aryloxy group of 5-50 nuclear carbon atoms, (un)substituted arylthio group of 5-50 nuclear carbon atoms, (un)substituted alkoxycarbonyl group of 1-50 carbon atoms, carboxy group, halogen atom, cyano group, nitro group, or hydroxy group;

a, b, and c are whole numbers of 0-4; and n is a whole number of 1-3;

and when n is 2 or more, the formula inside the parenthesis shown below can be the same or different.

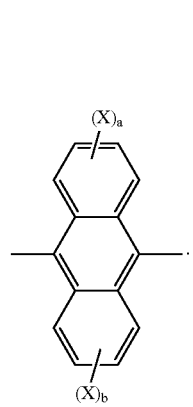

Furthermore, the present invention provides anthracene derivatives presented by general formula (F6) shown below

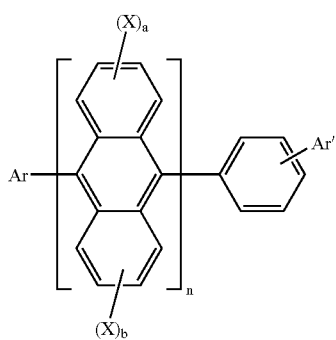

(F6)

wherein:

Ar is an (un)substituted condensed aromatic group of 10-50 nuclear carbon atoms;

Ar' is an (un)substituted aromatic group of 6-50 nuclear carbon atoms;

X is an (un)substituted aromatic group of 6-50 nuclear carbon atoms, (un)substituted aromatic heterocyclic group of 5-50 nuclear carbon atoms, (un)substituted alkyl group of 1-50 carbon atoms, (un)substituted alkoxy group of 1-50 carbon atoms, (un)substituted aralkyl group of 6-50 carbon atoms, (un)substituted aryloxy group of 5-50 nuclear carbon atoms, (un)substituted arylthio group of 5-50 nuclear carbon atoms, (un)substituted alkoxycarbonyl group of 1-50 carbon atoms, carboxy group, halogen atom, cyano group, nitro group, or hydroxy group;

a, b, and c are whole numbers of 0-4; and n is a whole number of 1-3; and when n is 2 or more, the formula inside the parenthesis shown below can be the same or different

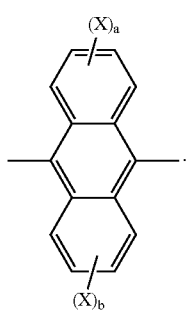

Specific examples of useful anthracene materials for use in a light-emitting layer include

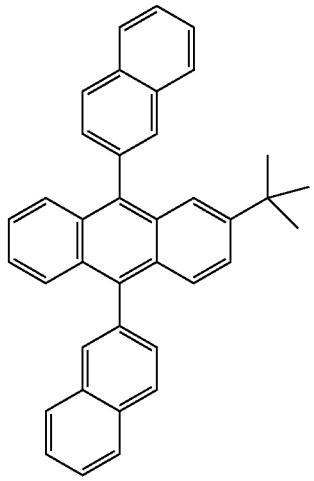

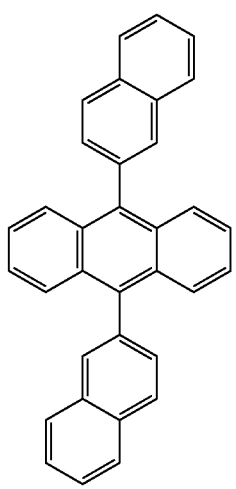

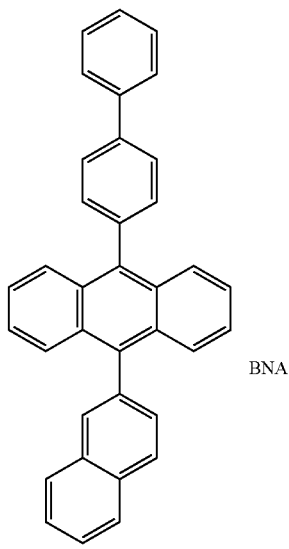

BNA

-continued

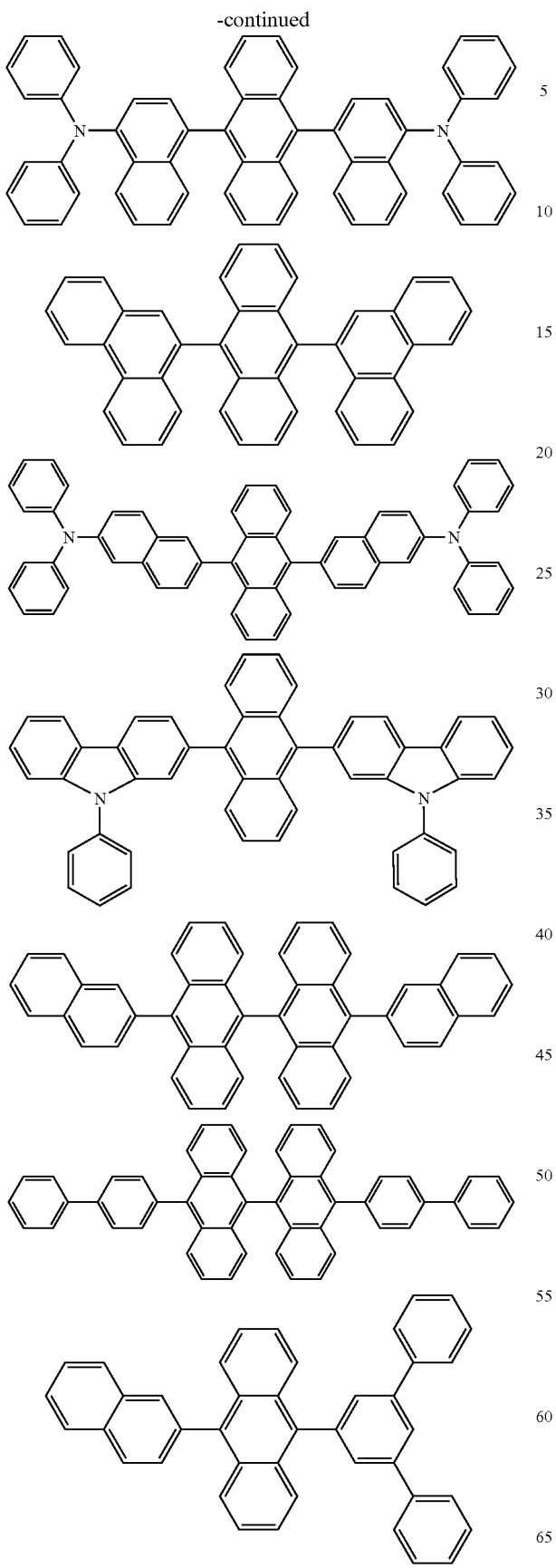

-continued

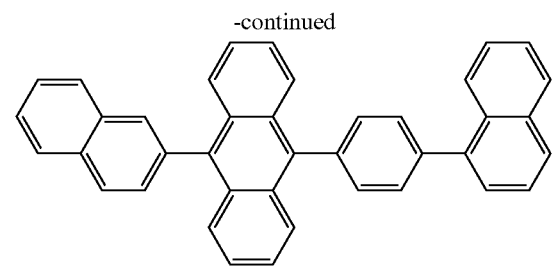

Benzazole derivatives (Formula G) constitute another class of useful host materials capable of supporting electroluminescence, and are particularly suitable for light emission of wavelengths longer than 400 nm, e.g., blue, green, yellow, orange or red.

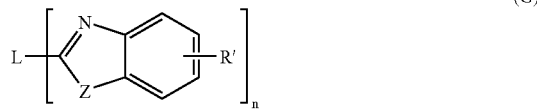

(G)

wherein:

n is an integer of 3 to 8;

Z is O, NR or S; and

R and R' are individually hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit consisting of alkyl, aryl, substituted alkyl, or substituted aryl, which connects the multiple benzazoles together. L may be either conjugated with the multiple benzazoles or not in conjugation with them. An example of a useful benzazole is 2,2',2"-(1,3,5-phenylene)tris[1-phenyl-1H-benzimidazole].

Styrylarylene derivatives as described in U.S. Pat. No. 5,121,029 and JP 08333569 are also useful hosts for blue emission. For example, 9,10-bis[4-(2,2-diphenylethenyl)phenyl]anthracene and 4,4'-bis(2,2-diphenylethenyl)-1,1'-biphenyl (DPVBi) are useful hosts for blue emission.

Useful fluorescent emitting materials include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrylium and thiapyrylium compounds, fluorene derivatives, periflanthene derivatives, indenoperylene derivatives, bis(azinyl)imine boron compounds, bis(azinyl)methene compounds, and carbostyryl compounds. Illustrative examples of useful materials include, but are not limited to, the following:

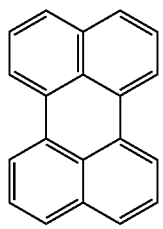
L1
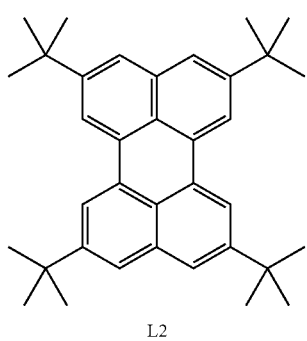
L2
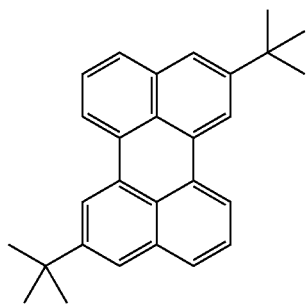
L3
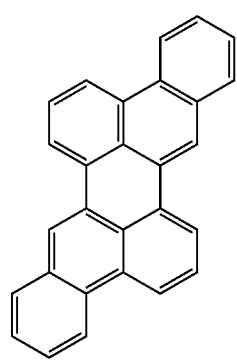
L4
-continued
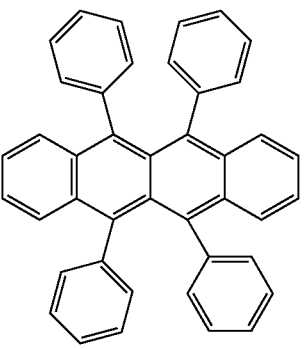
L5
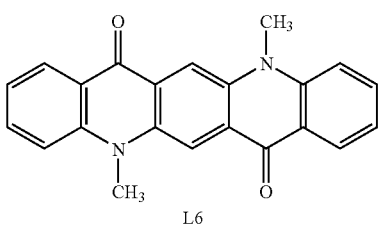
L6
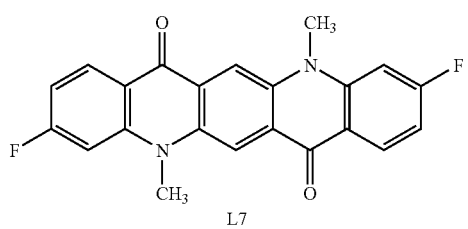
L7
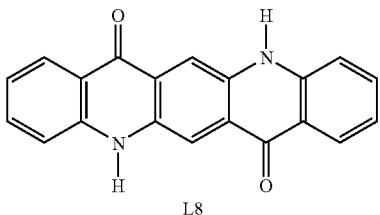
L8
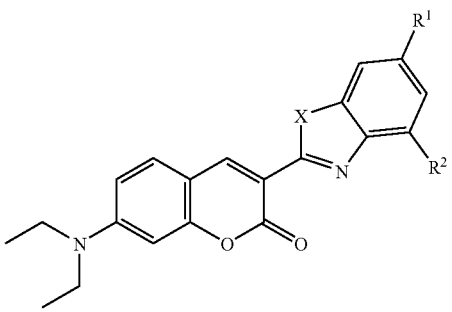
|     | X | R1     | R2     |
| --- | - | ------ | ------ |
| L9  | O | H      | H      |
| L10 | O | H      | Methyl |
| L11 | O | Methyl | H      |
| L12 | O | Methyl | Methyl |
| L13 | O | H      | t-butyl |
| L14 | O | t-butyl | H     |
| L15 | O | t-butyl | t-butyl |
| L16 | S | H      | H      |
| L17 | S | H      | Methyl |

-continued
| | | | |
|---|---|---|---|
| L18 | S | Methyl | H |
| L19 | S | Methyl | Methyl |
| L20 | S | H | t-butyl |
| L21 | S | t-butyl | H |
| L22 | S | t-butyl | t-butyl |
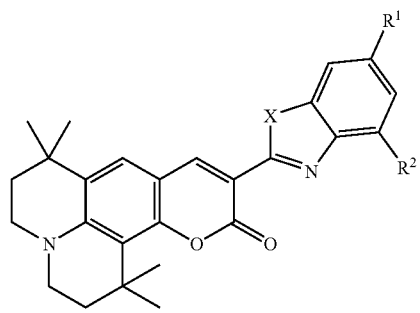
| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |
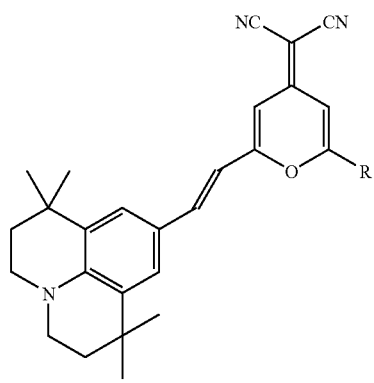
| | R |
|---|---|
| L37 | phenyl |
| L38 | methyl |
| L39 | t-butyl |
| L40 | mesityl |
-continued
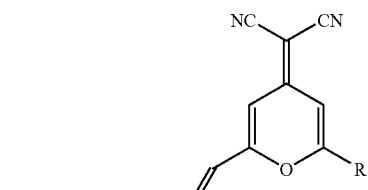
| | R |
|---|---|
| L41 | phenyl |
| L42 | methyl |
| L43 | t-butyl |
| L44 | mesityl |
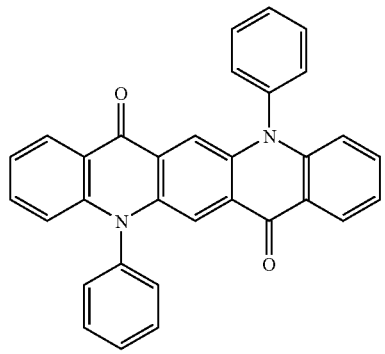
L45
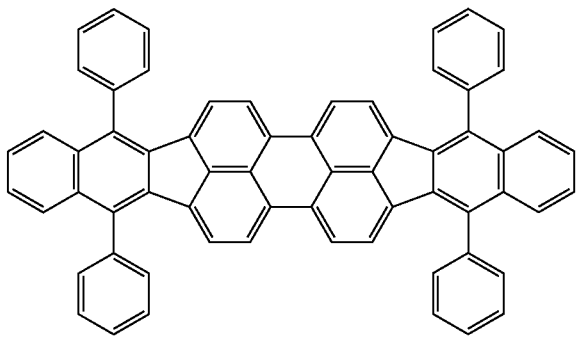
L46

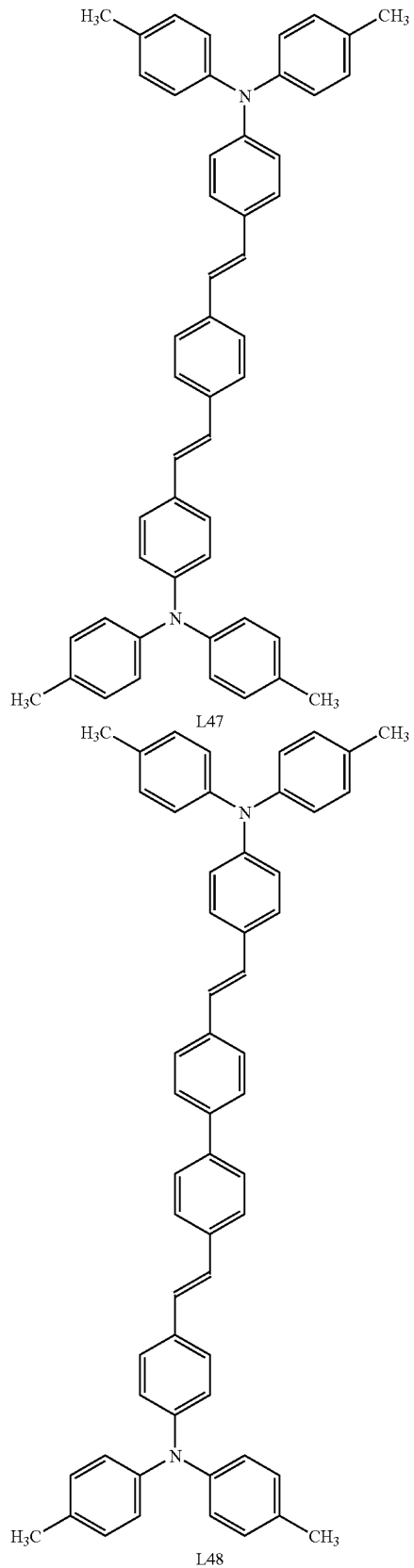
L47
L48
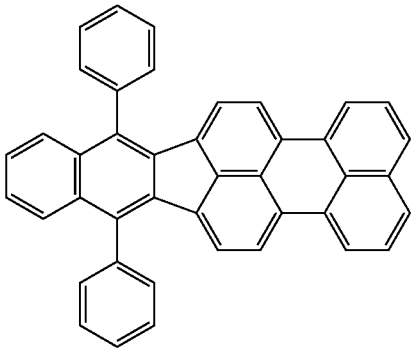
L49
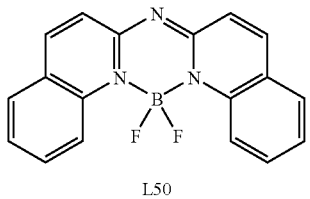
L50
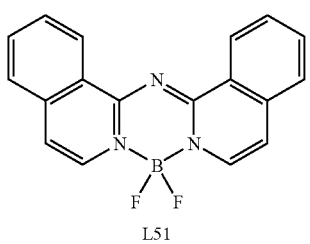
L51
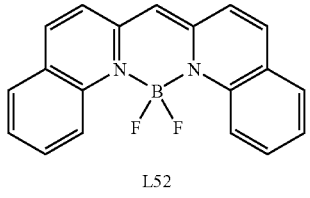
L52
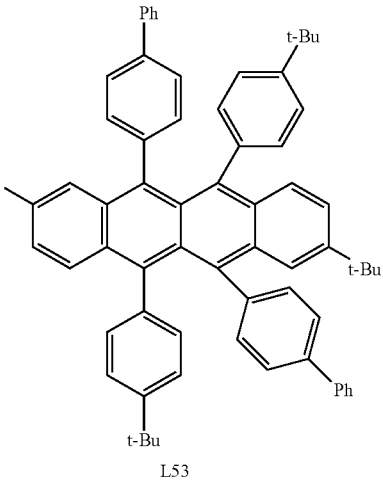
L53

-continued

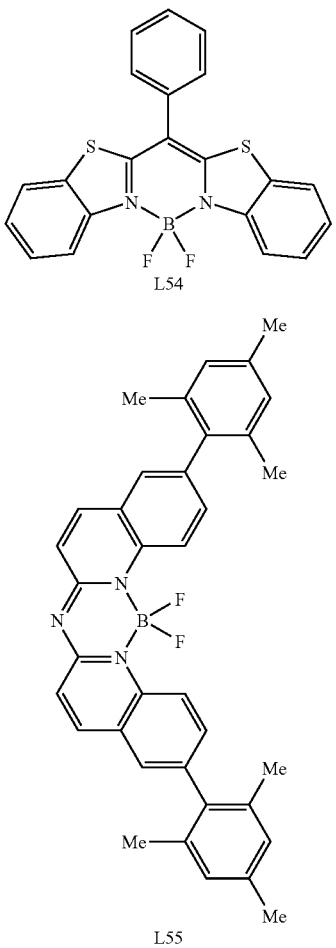

L54

L55

Light-emitting phosphorescent materials may be used in the EL device. For convenience, the phosphorescent complex guest material may be referred to herein as a phosphorescent material. The phosphorescent material typically includes one or more ligands, for example monoanionic ligands that can be coordinated to a metal through an $sp^2$ carbon and a heteroatom. Conveniently, the ligand can be phenylpyridine (ppy) or derivatives or analogs thereof. Examples of some useful phosphorescent organometallic materials include tris(2-phenylpyridinato-N,C$^{2'}$)iridium(III), bis(2-phenylpyridinato-N,C$^{2'}$)iridium(III)(acetylacetonate), and bis(2-phenylpyridinato-N,C$^{2'}$)platinum(II). Usefully, many phosphorescent organometallic materials emit in the green region of the spectrum, that is, with a maximum emission in the range of 510 to 570 nm.

Phosphorescent materials may be used singly or in combinations other phosphorescent materials, either in the same or different layers. Phosphorescent materials and suitable hosts are described in WO 00/57676, WO 00/70655, WO 01/41512 A1, WO 02/15645 A1, US 2003/0017361 A1, WO 01/93642 A1, WO 01/39234 A2, U.S. Pat. No. 6,458,475 B1, WO 02/071813 A1, U.S. Pat. No. 6,573,651 B2, US 2002/0197511 A1, WO 02/074015 A2, U.S. Pat. No. 6,451,455 B1, US 2003/0072964 A1, US 2003/0068528 A1, U.S. Pat. No. 6,413,656 B1, U.S. Pat. No. 6,515,298 B2, U.S. Pat. No. 6,451,415 B1, U.S. Pat. No. 6,097,147, US 2003/0124381 A1, US 2003/0059646 A1, US 2003/0054198 A1, EP 1 239 526 A2, EP 1 238 981 A2, EP 1 244 155 A2, US 2002/0100906 A1, US 2003/0068526 A1, US 2003/0068535 A1, JP 2003073387A, JP 2003 073388A, US 2003/0141809 A1, US 2003/0040627 A1, JP 2003059667A, JP 2003073665A, and US 2002/0121638 A1.

The emission wavelengths of cyclometallated Ir (III) complexes of the type IrL$_3$ and IrL$_2$L', such as the green-emitting fac-tris(2-phenylpyridinato-N,C$^{2'}$)iridium(III) and bis(2-phenylpyridinato-N,C$^{2'}$)iridium(III)(acetylacetonate) may be shifted by substitution of electron donating or withdrawing groups at appropriate positions on the cyclometallating ligand L, or by choice of different heterocycles for the cyclometallating ligand L. The emission wavelengths may also be shifted by choice of the ancillary ligand L'. Examples of red emitters are the bis(2-(2'-benzothienyl)pyridinato-N,C$^{3'}$)iridium(III)(acetylacetonate) and tris(2-phenylisoquinolinato-N,C)iridium(III). A blue-emitting example is bis(2-(4,6-difluorophenyl)-pyridinato-N,C$^{2'}$)iridium(III)(picolinate).

Red electrophosphorescence has been reported, using bis (2-(2'-benzo[4,5-a]thienyl)pyridinato-N,C$^3$) iridium (acetylacetonate) [Btp$_2$Ir(acac)] as the phosphorescent material (C. Adachi, S. Lamansky, M. A. Baldo, R. C. Kwong, M. E. Thompson, and S. R. Forrest, App. Phys. Lett., 78, 1622-1624 (2001)).

Other important phosphorescent materials include cyclometallated Pt(II) complexes such as cis-bis(2-phenylpyridinato-N,C$^{2'}$)platinum(II), cis-bis(2-(2'-thienyl)pyridinato-N, C$^{3'}$) platinum(II), cis-bis(2-(2'-thienyl)quinolinato-N,C$^{5'}$) platinum(II), or (2-(4,6-difluorophenyl)pyridinato-N,C$^{2'}$) platinum (II) (acetylacetonate). Pt (II) porphyrin complexes such as 2,3,7,8,12,13,17,18-octaethyl-21H, 23H-porphine platinum(II) are also useful phosphorescent materials.

Still other examples of useful phosphorescent materials include coordination complexes of the trivalent lanthanides such as Tb$^{3+}$ and Eu$^{3+}$ (J. Kido et al., Appl. Phys. Lett., 65, 2124 (1994)).

Suitable host materials for phosphorescent materials should be selected so that transfer of a triplet exciton can occur efficiently from the host material to the phosphorescent material but cannot occur efficiently from the phosphorescent material to the host material. Therefore, it is highly desirable that the triplet energy of the phosphorescent material be lower than the triplet energy of the host. Generally speaking, a large triplet energy implies a large optical bandgap. However, the band gap of the host should not be chosen so large as to cause an unacceptable barrier to injection of charge carriers into the light-emitting layer and an unacceptable increase in the drive voltage of the OLED. Suitable host materials are described in WO 00/70655 A2; 01/39234 A2; 01/93642 A1; 02/074015 A2; 02/15645 A1, and US 20020117662. Suitable hosts include certain aryl amines, triazoles, indoles and carbazole compounds. Examples of desirable hosts are 4,4'-N,N'-dicarbazole-biphenyl, otherwise known as 4,4'-bis(carbazol-9-yl) biphenyl or CBP; 4,4'-N,N'-dicarbazole-2,2'-dimethyl-biphenyl, otherwise known as 2,2'-dimethyl-4,4'-bis(carbazol-9-yl)biphenyl or CDBP; 1,3-bis(N,N'-dicarbazole)benzene, otherwise known as 1,3-bis(carbazol-9-yl)benzene, and poly (N-vinylcarbazole), including their derivatives.

Desirable host materials are capable of forming a continuous film.

Hole-Blocking Layer (HBL)

In addition to suitable hosts, an OLED device employing a phosphorescent material often requires at least one hole-blocking layer placed between the electron-transporting layer 111 and the light-emitting layer 109 to help confine the excitons and recombination events to the light-emitting layer comprising the host and phosphorescent material. In this case, there should be an energy barrier for hole migration from the host into the hole-blocking layer, while electrons should pass readily from the hole-blocking layer into the light-emitting layer comprising a host and a phosphorescent material. The first requirement entails that the ionization potential of the hole-blocking layer be larger than that of the light-emitting layer 109, desirably by 0.2 eV or more. The second requirement entails that the electron affinity of the hole-blocking layer not greatly exceed that of the light-emitting layer 109, and desirably be either less than that of light-emitting layer or not exceed that of the light-emitting layer by more than about 0.2 eV.

When used with an electron-transporting layer whose characteristic luminescence is green, such as an Alq-containing electron-transporting layer as described below, the requirements concerning the energies of the highest occupied molecular orbital (HOMO) and lowest unoccupied molecular orbital (LUMO) of the material of the hole-blocking layer frequently result in a characteristic luminescence of the hole-blocking layer at shorter wavelengths than that of the electron-transporting layer, such as blue, violet, or ultraviolet luminescence. Thus, it is desirable that the characteristic luminescence of the material of a hole-blocking layer be blue, violet, or ultraviolet. It is further desirable, but not absolutely required, that the triplet energy of the hole-blocking material be greater than that of the phosphorescent material. Suitable hole-blocking materials are described in WO 00/70655A2 and WO 01/93642 A1. Two examples of useful hole-blocking materials are bathocuproine (BCP) and bis(2-methyl-8-quinolinolato)(4-phenylphenolato)aluminum(III) (BAlq). The characteristic luminescence of BCP is in the ultraviolet, and that of BAlq is blue. Metal complexes other than BAlq are also known to block holes and excitons as described in US 20030068528. In addition, US 20030175553 A1 describes the use of fac-tris(1-phenylpyrazolato-N,$C^{2'}$)iridium(III) (Irppz) for this purpose.

When a hole-blocking layer is used, its thickness can be between 2 and 100 nm and suitably between 5 and 10 nm.

Electron-Transporting Layer (ETL)

In one embodiment, the layer of the invention functions as the only electron-transporting layer of the device. In other embodiments it may be desirable to have additional electron-transporting layers as described below.

Desirable thin film-forming materials for use in forming electron-transporting layer of organic EL devices are metal-chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary of contemplated oxinoid compounds are those satisfying structural formula (E), previously described.

Other electron-transporting materials suitable for use in the electron-transporting layer include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials. Triazines are also known to be useful as electron transporting materials.

If both a hole-blocking layer and an electron-transporting layer 111 are used, electrons should pass readily from the electron-transporting layer 111 into the hole-blocking layer. Therefore, the electron affinity of the electron-transporting layer 111 should not greatly exceed that of the hole-blocking layer. Desirably, the electron affinity of the electron-transporting layer should be less than that of the hole-blocking layer or not exceed it by more than about 0.2 eV.

If an electron-transporting layer is used, its thickness may be between 2 and 100 nm and suitably between 5 and 20 nm.

Other Useful Organic Layers and Device Architecture

In some instances, layers 109 through 111 can optionally be collapsed into a single layer that serves the function of supporting both light emission and electron transportation. The hole-blocking layer, when present, and layer 111 may also be collapsed into a single layer that functions to block holes or excitons, and supports electron transport. It also known in the art that emitting materials may be included in the hole-transporting layer 107. In that case, the hole-transporting material may serve as a host. Multiple materials may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, US 20020025419, EP 1 182 244, U.S. Pat. No. 5,683,823, U.S. Pat. No. 5,503,910, U.S. Pat. No. 5,405,709, and U.S. Pat. No. 5,283,182 and can be equipped with a suitable filter arrangement to produce a color emission.

This invention may be used in so-called stacked device architecture, for example, as taught in U.S. Pat. No. 5,703,436 and U.S. Pat. No. 6,337,492.

Deposition of Organic Layers

The organic materials mentioned above are suitably deposited through sublimation, but can be deposited from a solvent with an optional binder to improve film formation. If the material is a polymer, solvent deposition is usually preferred. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. No. 5,851,709 and U.S. Pat. No. 6,066,357) and inkjet method (U.S. Pat. No. 6,066,357).

Organic materials useful in making OLEDs, for example organic hole-transporting materials, organic light-emitting materials doped with an organic electroluminescent components have relatively complex molecular structures with relatively weak molecular bonding forces, so that care must be taken to avoid decomposition of the organic material(s) during physical vapor deposition. The aforementioned organic materials are synthesized to a relatively high degree of purity, and are provided in the form of powders, flakes, or granules. Such powders or flakes have been used heretofore for placement into a physical vapor deposition source wherein heat is applied for forming a vapor by sublimation or vaporization of the organic material, the vapor condensing on a substrate to provide an organic layer thereon.

Several problems have been observed in using organic powders, flakes, or granules in physical vapor deposition: These powders, flakes, or granules are difficult to handle. These organic materials generally have a relatively low physical density and undesirably low thermal conductivity, particularly when placed in a physical vapor deposition source which is disposed in a chamber evacuated to a reduced pressure as low as $10^{-6}$ Torr. Consequently, powder particles, flakes, or granules are heated only by radiative heating from a heated source, and by conductive heating of particles or flakes directly in contact with heated surfaces of the source. Powder particles, flakes, or granules which are not in contact with heated surfaces of the source are not effectively heated by conductive heating due to a relatively low particle-to-particle contact area; This can lead to nonuniform heating of such organic materials in physical vapor deposition sources. Therefore, result in potentially nonuniform vapor-deposited organic layers formed on a substrate.

These organic powders can be consolidated into a solid pellet. These solid pellets consolidating into a solid pellet from a mixture of a sublimable organic material powder are easier to handle. Consolidation of organic powder into a solid pellet can be accomplished with relatively simple tools. A solid pellet formed from mixture comprising one or more non-luminescent organic non-electroluminescent component materials or luminescent electroluminescent component materials or mixture of non-electroluminescent component and electroluminescent component materials can be placed into a physical vapor deposition source for making organic layer. Such consolidated pellets can be used in a physical vapor deposition apparatus.

In one aspect, the present invention provides a method of making an organic layer from compacted pellets of organic materials on a substrate, which will form part of an OLED.

One preferred method for depositing the materials of the present invention is described in US 2004/0255857 and U.S. Ser. No. 10/945,941 where different source evaporators are used to evaporate each of the materials of the present invention. A second preferred method involves the use of flash evaporation where materials are metered along a material feed path in which the material feed path is temperature controlled. Such a preferred method is described in the following co-assigned patent applications: U.S. Ser. No. 10/784,585; U.S. Ser. No. 10/805,980; U.S. Ser. No. 10/945,940; U.S. Ser. No. 10/945,941; U.S. Ser. No. 11/050,924; and U.S. Ser. No. 11/050,934. Using this second method, each material may be evaporated using different source evaporators or the solid materials may be mixed prior to evaporation using the same source evaporator.

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as $SiO_x$, Teflon, and alternating inorganic/polymeric layers are known in the art for encapsulation. Any of these methods of sealing or encapsulation and desiccation can be used with the EL devices constructed according to the present invention.

Optical Optimization

OLED devices of this invention can employ various well-known optical effects in order to enhance their emissive properties if desired. This includes optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color-conversion filters over the display. Filters, polarizers, and anti-glare or anti-reflection coatings may be specifically provided over the EL device or as part of the EL device.

Embodiments of the invention may provide advantageous features such as higher luminous yield, lower drive voltage, and higher power efficiency, longer operating lifetimes or ease of manufacture. Embodiments of devices useful in the invention can provide a wide range of hues including those useful in the emission of white light (directly or through filters to provide multicolor displays). Embodiments of the invention can also provide an area lighting device.

The invention and its advantages are further illustrated by the specific examples that follow.

EXAMPLES

Examples 9, 16, 17, 21, 22, 23, 24, and 25 are particularly directed to the invention claimed herein. The term "percentage" or "percent" and the symbol "%" indicate the volume percent (or a thickness ratio as measured on a thin film thickness monitor) of a particular first or second compound of the total material in the layer of the invention and other components of the devices. If more than one second compound is present, the total volume of the second compounds can also be expressed as a percentage of the total material in the layer of the invention.

Example 1a

Synthesis of Cpd-2

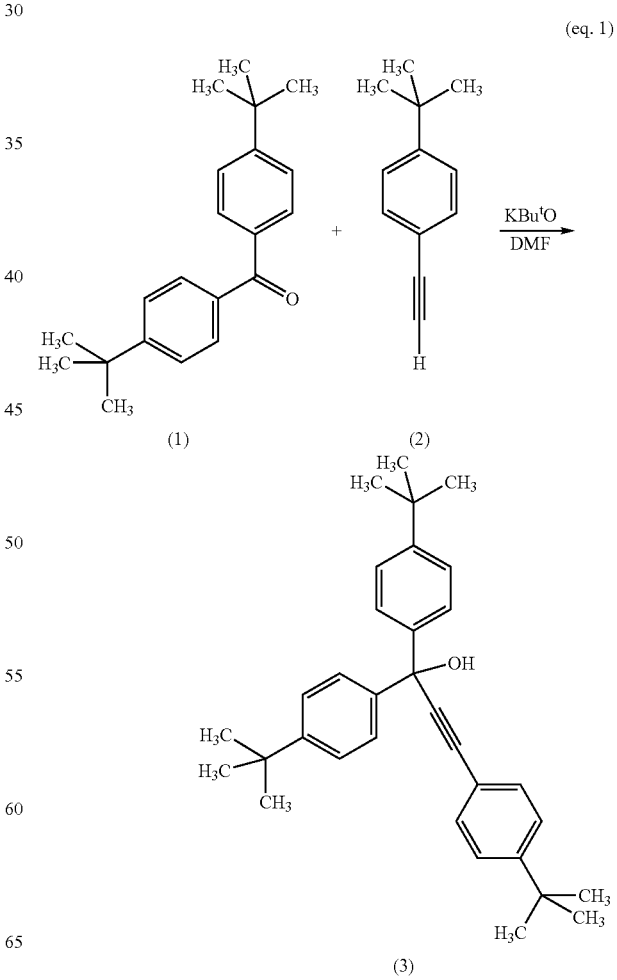

-continued

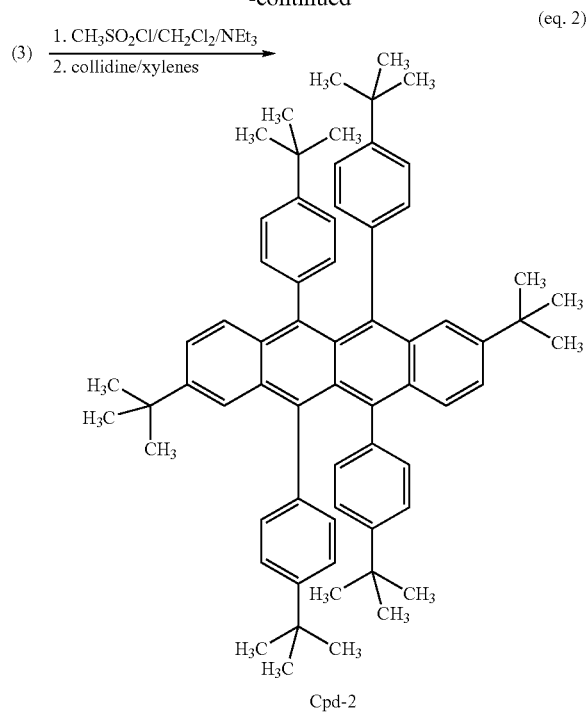

Cpd-2

Compound (3), eq. 1, was prepared in the following manner. Under a nitrogen atmosphere, acetylenic compound (2) (2.0 g, 12 mMole), was dissolved in dimethylformamide (DMF) (100 mL) and the solution cool to 0° C. Potassium t-butoxide (KBu$^t$O) (1.4 g, 12 mMole), was added and the mixture stirred well for approximately 15 minutes. To this mixture was then added the benzophenone (1) (3.53 g, 30 mMole). Stirring was continued at 0° C. for approximately 30 minutes and then allowed to come to room temperature over a 1-hour period. At the end of this time the solution was cooled to 0° C. and the reaction treated with saturated sodium chloride (20 mL). The mixture was then diluted with ethyl acetate, washed with 2N—HCl (3 times), dried over MgSO$_4$, filtered and concentrated under reduced pressure. The crude product was triturated with petroleum ether to give the product as an off-white solid. The yield of compound (3) was 3.0 g.

Compound (3) (7.0 g, 15 mMole) was dissolved in methylene chloride (CH$_2$Cl$_2$) (70 mL), and stirred at 0° C. under a nitrogen atmosphere. To this solution was added triethylamine (NEt$_3$) (1.56 g, 15 mMole) and then the mixture was treated drop by drop with methanesulfonyl chloride (CH$_3$SO$_2$Cl) (1.92 g, 15 mMole), keeping the temperature of the reaction in the range 0-5° C. After the addition, the solution was stirred at 0° C. for 30 minutes, and then allowed to warm to room temperature over 1 hour. The reaction was then heated to reflux, distilling off the methylene chloride solvent. The methylene chloride solvent was gradually replaced by adding xylenes (a total of 70 mL). When the internal temperature of the reaction reached 80° C., collidine (2.40 g, 19.82 mMole), dissolved in xylenes (10 mL) was added drop by drop over a 10-minute period. The temperature was then raised to 110° C. and held at this temperature for 4 hours. After this period the reaction was cooled and concentrated under reduced pressure. The oily residue was stirred with methanol (70 mL) to give the crude product. This material was filtered off, washed with methanol and petroleum ether to give compound Cpd-2 as a bright red solid. The yield was 1.5 g and Cpd-2 had a melting point of 300-305° C. The product may be further purified by sublimation (250° C. @ 200 millitorr) with a N$_2$ carrier gas.

Example 1b

Synthesis of MC-1

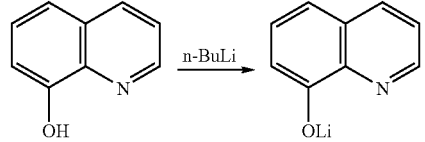

8-Hydroxyquinoline (4.64 g, 31.96 mMoles) was dissolved in acetonitrile (50 mL). To this solution was added 2.5M n-BuLi (15.5 mL, 36.36 mMoles) drop by drop at room temperature under a nitrogen atmosphere. After the addition of the n-BuLi, the mixture was stirred for 1 hour. The yellow solid was filtered off, washed with a little cold water, acetonitrile and finally air dried. The yield of lithium 8-quinolate (Liq) was 4.8 g.

Example 2

Preparation of Devices 1-1 Through 1-6

A series of EL devices (1-1 through 1-6) were constructed in the following manner.
1. A glass substrate coated with an 85 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL) by plasma-assisted deposition of CHF$_3$ as described in U.S. Pat. No. 6,208,075.
3. Next a layer of hole-transporting material 4,4'-Bis[N-(1-naphthyl)-N-phenylamino]biphenyl (NPB) was deposited to a thickness of 75 nm.
4. A 35 nm light-emitting layer (LEL) corresponding to the host material rubrene and 0.5% by volume of L46 was then deposited.
5. A 35 nm electron-transporting layer (ETL) of MC-3 or Cpd-1 (Rubrene) or a mixture of the two (see Table 1) was vacuum-deposited over the LEL.
6. 0.5 nm layer of lithium fluoride was vacuum deposited onto the ETL, followed by a 150 nm layer of aluminum, to form a cathode layer.

The above sequence completes the deposition of the EL device. The device is then hermetically packaged in a dry glove box for protection against ambient environment.

L46

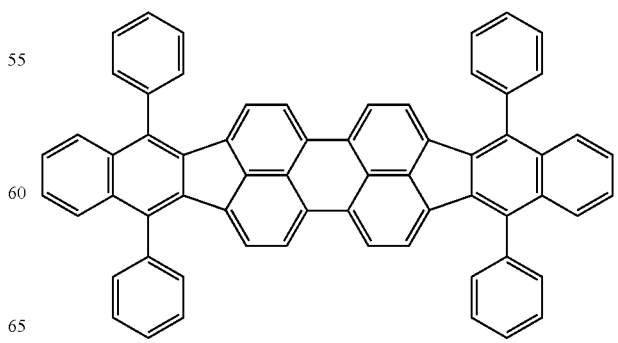

The devices thus formed were tested for luminous efficiency at an operating current of 20 mA/cm$^2$ and the results are reported in Table 1. The color of light the devices produced was approximately the same and corresponded to average 1931 CIE (Commission Internationale de L'Eclairage) CIEx, CIEy coordinates of 0.65, 0.35.

TABLE 1

Device 1-1 through 1-6, Example 2.

| Device | Example | % MC-3 | % Cpd-1 | Voltage (V) | Voltage Change[1] | Luminance Efficiency (W/A) | Luminance Efficiency Change[1] |
|---|---|---|---|---|---|---|---|
| 1-1 | Comparison | 100 | 0 | 7.72 | — | 0.047 | — |
| 1-2 | Comparison | 90 | 10 | 6.11 | −21% | 0.022 | −53% |
| 1-3 | Invention | 75 | 25 | 4.00 | −48% | 0.079 | +68% |
| 1-4 | Invention | 50 | 50 | 3.83 | −50% | 0.077 | +64% |
| 1-5 | Invention | 25 | 75 | 3.83 | −50% | 0.067 | +43% |
| 1-6 | Comparison | 0 | 100 | 3.79 | −51% | 0.000 | −100% |

[1]Relative to device 1-1.

It can be seen from Table 1 that by using a mixture of MC-3 and more than 10% of Cpd-1 in the electron-transporting layer, one can obtain devices with very low voltage and good luminance. An ETL composed of only MC-3 or only Cpd-1, or a mixture of 10% Cpd-1 and 90% MC-3 affords a device that exhibits higher voltage and inferior luminance.

Example 3

Preparation Of Devices 2-1 Through 2-6

A series of EL devices (2-1 through 2-6) were constructed in exactly the same manner as in Example 2, except the electron-transporting layer consisted of Alq, MC-3, or Cpd-1 or mixtures of MC-3 and Cpd-1, see Table 2.

The devices thus formed were tested for luminous efficiency at an operating current of 20 mA/cm$^2$ and the results are reported in Table 2. The color of light the devices produced was approximately the same and corresponded to average CIEx, CIEy coordinates of 0.65, 0.35.

TABLE 2

Device data for 2-1 through 2-6, Example 3.

| Device | Example | % Alq | % MC-3 | % Cpd-1 | Voltage (V) | Voltage Change[1] | Luminance Efficiency (W/A) | Efficiency Change[1] |
|---|---|---|---|---|---|---|---|---|
| 2-1 | Comparison | 100 | 0 | 0% | 5.66 | — | 0.044 | — |
| 2-2 | Comparison | — | 100 | 0% | 8.29 | +46% | 0.041 | −7% |
| 2-3 | Invention | — | 75 | 25% | 4.48 | −21% | 0.078 | +77% |
| 2-4 | Invention | — | 50 | 50% | 4.29 | −24% | 0.079 | +80% |
| 2-5 | Invention | — | 25 | 75% | 4.46 | −21% | 0.071 | +61% |
| 2-6 | Comparison | — | 0 | 100% | 5.41 | −4% | 0.001 | −98% |

[1]Relative to device 2-1.

As illustrated in Table 2, by using a mixture of MC-3 and Cpd-1 in the electron-transporting layer one can obtain very low voltage and good luminance relative to using only MC-3 or only Cpd-1 or only Alq, which is the most common electron-transporting material in the industry.

Example 4

Preparation of Devices 3-1 Through 3-6

A series of EL devices (3-1 through 3-6) were constructed in exactly the same manner as in Example 2, except the electron-transporting layer consisted of Alq, MC-3, or Cpd-3 or mixtures of MC-3 and Cpd-3, see Table 3.

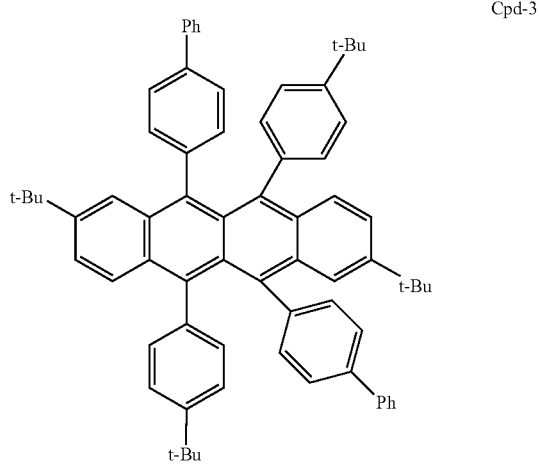

Cpd-3

The devices thus formed were tested for luminous efficiency at an operating current of 20 mA/cm² and the results are reported in Table 3. The color of light the devices produced was approximately the same and corresponded to average CIEx, CIEy coordinates of 0.65, 0.35.

As can be seen from Table 3, use of mixtures of MC-3 and Cpd-3 in the ETL provide devices (3-3, 3-4, and 3-5) that exhibit very low voltage and good luminance relative to a device using only MC-3 (device 3-2) or only Cpd-3 (device 3-6) or only Alq (device 3-1) as the electron-transporting material.

Example 5

Fabrication of Devices 4-1 Through 4-12

A series of EL devices (4-1 through 4-12) were constructed in the following manner.

1. A glass substrate coated with an 85 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL) by plasma-assisted deposition of $CHF_3$ as described in U.S. Pat. No. 6,208,075.
3. Next a layer of hole-transporting material 4,4'-Bis[N-(1-naphthyl)-N-phenylamino]biphenyl (NPB) was deposited to a thickness of 75 nm.
4. A 20 nm light-emitting layer (LEL) corresponding to 9-(4-biphenyl)-10-(2-naphthyl)anthracene, 6% of NPB, and 2% of 2,5,8,11-tetra-t-butylperylene was then deposited.
5. A 35 nm electron-transporting layer (ETL) of MC-3 or a mixture of Cpd-3 and MC-3, see Table 4, was vacuum-deposited over the LEL.
6. 0.5 nm layer of lithium fluoride was vacuum deposited onto the ETL, followed by a 150 nm layer of aluminum, to form a cathode layer.

The above sequence completes the deposition of the EL device. The device is then hermetically packaged in a dry glove box for protection against ambient environment.

The devices thus formed were tested for luminous efficiency at an operating current of 20 mA/cm² and the results are reported in Table 4. The color of light the devices produced in CIEx, CIEy coordinates is also reported in Table 4.

TABLE 3

Device data for 3-1 through 3-6, Example 4.

| Device | Example | % Alq | % MC-3 | % Cpd-3 | Voltage (V) | Voltage Change[1] | Luminance Efficiency (W/A) | Luminance Efficiency Change[1] |
|---|---|---|---|---|---|---|---|---|
| 3-1 | Comparison | 100 | 0 | 0% | 5.68 | — | 0.045 | — |
| 3-2 | Comparison | — | 100 | 0% | 8.26 | +45% | 0.039 | −13% |
| 3-3 | Invention | — | 75 | 25% | 5.09 | −10% | 0.074 | +64% |
| 3-4 | Invention | — | 50 | 50% | 4.60 | −19% | 0.081 | +80% |
| 3-5 | Invention | — | 25 | 75% | 4.83 | −15% | 0.063 | +40% |
| 3-6 | Comparison | — | 0 | 100% | 5.53 | −3% | 0.002 | −96% |

[1]Relative to device 3-1.

TABLE 4

Device data for 4-1 through 4-12, Example 5.

| Device | Example | % MC-3 | % Cpd-3 | CIEx | CIEy | Voltage (V) | Voltage Change[1] | Luminance Efficiency (W/A) | Luminance Efficiency Change[1] |
|---|---|---|---|---|---|---|---|---|---|
| 4-1 | Comparative | 100 | 0 | 0.141 | 0.199 | 11.30 | — | 0.039 | — |
| 4-2 | Comparative | 95 | 5 | 0.335 | 0.317 | 11.30 | 0% | 0.008 | −79% |
| 4-3 | Comparative | 90 | 10 | 0.208 | 0.231 | 9.60 | −15% | 0.028 | −28% |
| 4-4 | Inventive | 80 | 20 | 0.158 | 0.203 | 7.13 | −37% | 0.061 | +56% |
| 4-5 | Inventive | 70 | 30 | 0.150 | 0.196 | 6.12 | −46% | 0.067 | +72% |
| 4-6 | Inventive | 60 | 40 | 0.151 | 0.198 | 5.80 | −49% | 0.062 | +59% |
| 4-7 | Inventive | 50 | 50 | 0.151 | 0.202 | 5.75 | −49% | 0.060 | +54% |
| 4-8 | Inventive | 40 | 60 | 0.152 | 0.202 | 5.58 | −51% | 0.062 | +59% |
| 4-9 | Inventive | 30 | 70 | 0.153 | 0.201 | 5.66 | −50% | 0.064 | +64% |
| 4-10 | Inventive | 20 | 80 | 0.155 | 0.199 | 5.70 | −50% | 0.065 | +67% |
| 4-11 | Inventive | 10 | 90 | 0.162 | 0.208 | 6.28 | −44% | 0.059 | +51% |
| 4-12 | Inventive | 5 | 95 | 0.164 | 0.208 | 6.88 | −39% | 0.058 | +49% |

[1]Relative to device 4-1.

As illustrated in Table 4, when the electron-transporting layer of a device consists of MC-3 mixed with either 5% or 10% of Cpd-3, one can obtain some reduction in the device voltage but the luminance is very poor and the color is shifted significantly relative to when only MC-3 is used. Using MC-3 and more than 10% Cpd-3 provides very low voltage and good luminance and color.

Example 6

Fabrication of Comparison Devices 5-1 Through 5-12

A series of EL devices (5-1 through 5-12) were constructed in exactly the same manner as in Example 5, except the electron-transporting layer consisted of MC-3 or a mixture of MC-3 and Cpd-1, see Table 5.

The devices thus formed were tested for luminous efficiency at an operating current of 20 mA/cm$^2$ and the results are reported in Table 5. The color the devices produced in CIEx, CIEy coordinates is also reported in Table 5.

TABLE 5

Device data for 5-1 through 5-12, Example 6.

| Device | Example | % MC-3 | % Cpd-1 | CIEx | CIEy | Voltage (V) | Voltage Change[1] | Lum. Eff. (W/A) | Lum. Eff. Change[1] |
|---|---|---|---|---|---|---|---|---|---|
| 5-1 | Comparative | 100 | 0 | 0.139 | 0.197 | 11.00 | — | 0.046 | — |
| 5-2 | Comparative | 95 | 5 | 0.304 | 0.330 | 11.60 | +5% | 0.004 | −91% |
| 5-3 | Comparative | 90 | 10 | 0.165 | 0.211 | 9.19 | −16% | 0.032 | −30% |
| 5-4 | Inventive | 80 | 20 | 0.145 | 0.195 | 6.58 | −40% | 0.062 | +35% |
| 5-5 | Inventive | 70 | 30 | 0.142 | 0.192 | 5.91 | −46% | 0.063 | +37% |
| 5-6 | Inventive | 60 | 40 | 0.141 | 0.191 | 5.66 | −49% | 0.062 | +35% |
| 5-7 | Inventive | 50 | 50 | 0.141 | 0.194 | 6.73 | −39% | 0.059 | +28% |
| 5-8 | Inventive | 40 | 60 | 0.140 | 0.192 | 5.89 | −46% | 0.061 | +33% |
| 5-9 | Inventive | 30 | 70 | 0.140 | 0.189 | 5.84 | −47% | 0.061 | +33% |
| 5-10 | Inventive | 20 | 80 | 0.141 | 0.193 | 5.73 | −48% | 0.059 | +28% |
| 5-11 | Inventive | 10 | 90 | 0.141 | 0.193 | 5.99 | −46% | 0.057 | +24% |
| 5-12 | Inventive | 5 | 95 | 0.141 | 0.193 | 6.35 | −42% | 0.054 | +17% |

[1]Relative to device 5-1.

As can be seen from Table 5, in a device where the electron-transporting layer corresponds to MC-3 mixed with 5% of Cpd-1, one obtains a small voltage increase. There is some reduction in the device voltage when a mixture of MC-3 and 10% Cpd-1 is used. In both cases the corresponding devices have poor luminance and produce a significantly shifted color relative to a device having only MC-3 in the ETL. Devices in which the ETL consists of MC-3 mixed with more than 10% Cpd-1 afford very low voltage as well as good color and luminance.

Example 7

Fabrication of Comparison Devices 6-1 Through 6-6

EL devices, 6-1 through 6-6, for the purposes of comparison, were constructed in the following in the manner. A glass substrate coated with an 85 nm layer of indium-tin oxide (ITO) as the anode was sequentially ultrasonicated in a commercial detergent, rinsed in deionized water, degreased in toluene vapor and exposed to oxygen plasma for about 1 min.

1. Over the ITO was deposited a 1 mm fluorocarbon (CF$_x$) hole-injecting layer (HIL) by plasma-assisted deposition of CHF$_3$ as described in U.S. Pat. No. 6,208,075.

2. A hole-transporting layer (HTL) of N,N'-di-1-naphthalenyl-N,N'-diphenyl-4,4'-diaminobiphenyl (NPB) having a thickness of 75 nm was then evaporated onto a).

3. A 35 nm light-emitting layer (LEL) of tris(8-quinolino-lato)aluminum (III) (Alq) was then deposited onto the hole-transporting layer.
4. A 35 nm electron-transporting layer (ETL) of Alq or MC-3 or mixtures of the two, as indicated in indicated in Table 6, was then deposited onto the light-emitting layer.
5. On top of the ETL was deposited a 0.5 nm layer of LiF.
6. On top of the LiF layer was deposited a 100 nm layer of Al to form the cathode.

The above sequence completed the deposition of the EL device. The device was then hermetically packaged in a dry glove box for protection.

The devices thus formed were tested for luminous efficiency at an operating current of 20 mA/cm$^2$ and the results are reported in Table 6 in the form of efficiency (w/A) and voltage (V).

TABLE 6

Device data for 6-1 thorough 6-6, Example 7.

| Device | Example | % MC-3 | % Alq | Efficiency (W/A) | Voltage (V) | Voltage Change[1] |
|---|---|---|---|---|---|---|
| 6-1 | Comparison | 0 | 100 | 0.024 | 8.29 | 0% |
| 6-2 | Comparison | 10 | 90 | 0.025 | 8.49 | +2% |
| 6-3 | Comparison | 25 | 75 | 0.025 | 8.44 | +2% |
| 6-4 | Comparison | 50 | 50 | 0.023 | 8.92 | +8% |
| 6-5 | Comparison | 75 | 25 | 0.020 | 10.90 | +31% |
| 6-6 | Comparison | 100 | 0 | 0.020 | 12.10 | +46% |

[1]Relative to device 6-1.

It can be seen from Table 6 that the devices using mixtures of Alq and MC-3 as the electron-transporting materials did not afford a voltage reduction relative to the devices using only Alq, but instead gave an increase in voltage.

Example 8

Fabrication of Devices 7-1 Through 7-9

A series of EL devices (7-1 through 7-9) were constructed in the following manner.
1. A glass substrate coated with an 85 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL1) by plasma-assisted deposition of CHF$_3$ as described in U.S. Pat. No. 6,208,075.
3. A hole-injecting layer (HIL2) of dipyrazino[2,3-f:2',3'-h]quinoxalinehexacarbonitrile was deposited to a thickness of 10 nm.
4. Next a layer of hole-transporting material 4,4'-Bis[N-(1-naphthyl)-N-phenylamino]biphenyl (NPB) was deposited to a thickness of 65 nm.
5. A 35 nm light-emitting layer (LEL) of Alq$_3$ was then deposited.
6. A 35 nm electron-transporting layer (ETL) of Alq$_3$ or a mixture of Cpd-1 (rubrene) and lithium fluoride (LiF), see Table 7, was vacuum-deposited over the LEL.
7. 0.5 nm layer of lithium fluoride was vacuum deposited onto the ETL, followed by a 100 nm layer of aluminum, to form a cathode layer.

The above sequence completes the deposition of the EL device. The device is then hermetically packaged in a dry glove box for protection against ambient environment.

The devices thus formed were tested for luminous efficiency at an operating current of 20 mA/cm$^2$ and the results are reported in Table 7. The color of light the devices produced in CIEx, CIEy coordinates is also reported in Table 7.

TABLE 7

Device data for 7-1 through 7-9, Example 8.

| Device | Example | % Alq$_3$ | % Cpd-1 | % LiF | CIEx | CIEy | Volt.[1] (V) | Luminance Efficiency (W/A) |
|---|---|---|---|---|---|---|---|---|
| 7-1 | Comparative | 100 | 0 | 0 | 0.437 | 0.529 | 10.7 | 0.009 |
| 7-2 | Comparative | 0 | 100 | 0 | 0.342 | 0.544 | 8.6 | 0.019 |
| 7-3 | Inventive | 0 | 95 | 5 | 0.336 | 0.544 | 8.0 | 0.020 |
| 7-4 | Inventive | 0 | 90 | 10 | 0.337 | 0.544 | 8.1 | 0.020 |
| 7-5 | Inventive | 0 | 85 | 15 | 0.336 | 0.545 | 7.9 | 0.020 |
| 7-6 | Inventive | 0 | 80 | 20 | 0.339 | 0.544 | 8.3 | 0.020 |
| 7-7 | Inventive | 0 | 70 | 30 | 0.339 | 0.545 | 8.4 | 0.020 |
| 7-8 | Inventive | 0 | 50 | 50 | 0.332 | 0.546 | 7.5 | 0.022 |
| 7-9 | Inventive | 0 | 25 | 75 | 0.331 | 0.549 | 7.5 | 0.024 |

[1]The voltage needed to produce an operating current of 20 mA/cm$^2$

As illustrated in Table 7, when the electron-transporting layer of a device consists of Cpd-1 mixed with 5% to 75% of lithium fluoride (LiF), one can obtain reduction in the device voltage and better luminance efficiency and when compared to the comparisons; device 7-1, Alq$_3$ (100%) or device 7-2, Cpd-1 (100%).

Example 9

Fabrication of Devices 8-1 Through 8-6

A series of EL devices (8-1 through 8-6) were constructed in the following manner.
1. A glass substrate coated with an 85 nm layer of indium-tin oxide (ITO), as the anode, was sequentially ultrasonicated in a commercial detergent, rinsed in deionized water, degreased in toluene vapor and exposed to oxygen plasma for about 1 min.

2. Over the ITO was deposited a 1 nm fluorocarbon (CFx) hole-injecting layer (HIL1) by plasma-assisted deposition of $CHF_3$ as described in U.S. Pat. No. 6,208,075.
3. Next a layer of hole-transporting material 4,4'-Bis[N-(1-naphthyl)-N-phenylamino]biphenyl (NPB) was deposited to a thickness of 75 nm.
4. A 35 nm light-emitting layer (LEL) of $Alq_3$ was then deposited.
5. A 35 nm electron-transporting layer (ETL) of $Alq_3$ or a mixture of Cpd-1 (rubrene) and MC-20, see Table 8, was vacuum-deposited over the LEL.
6. 0.5 nm layer of lithium fluoride was vacuum deposited onto the ETL, followed by a 150 nm layer of aluminum, to form a cathode layer.

The above sequence completes the deposition of the EL device. The device is then hermetically packaged in a dry glove box for protection against ambient environment.

The devices thus formed were tested for drive voltage and luminous efficiency at an operating current of 20 mA/cm² and the results are reported in Table 8.

TABLE 8

Device data for 8-1 through 8-6, Example 9.

| Device | Example | % $Alq_3$ | % MC-20 | % Cpd-1 | Volt.[1] (V) | Luminance Efficiency (W/A) |
|---|---|---|---|---|---|---|
| 8-1 | Comparative | 100 | 0 | 0 | 7.2 | 0.020 |
| 8-2 | Inventive | | 100 | | 6.9 | 0.019 |
| 8-3 | Inventive | 0 | 10 | 90 | 5.9 | 0.019 |
| 8-4 | Inventive | 0 | 25 | 75 | 5.4 | 0.019 |
| 8-5 | Inventive | 0 | 50 | 50 | 5.6 | 0.019 |
| 8-6 | Inventive | 0 | 75 | 25 | 6.0 | 0.019 |

[1]The voltage needed to produce an operating current of 20 mA/cm²

As illustrated in the inventive examples of Table 8, when the electron-transporting layer of a device consists of the metal complex MC-20 or mixed with carbocycle Cpd-1, one can obtain a reduction in the device voltage, while still maintaining good luminance efficiency compared to the comparison devices; example 8-1, $Alq_3$ (100%).

Example 10

Fabrication of Devices 9-1 Through 9-6

A series of EL devices (9-1 through 9-6) were constructed in the following manner.

1. A glass substrate coated with an 85 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL1) by plasma-assisted deposition of $CHF_3$ as described in U.S. Pat. No. 6,208,075.
3. A hole-injecting layer (HIL2) of dipyrazino[2,3-f:2',3'-h]quinoxalinehexacarbonitrile was deposited to a thickness of 10 nm.
4. Next a layer of hole-transporting material 4,4'-Bis[N-(1-naphthyl)-N-phenylamino]biphenyl (NPB) was deposited to a thickness of 134 nm.
5. A 40 nm light-emitting layer (LEL) of red dopant, L46 (0.5 volume %) in Cpd-1 was then deposited.

L46

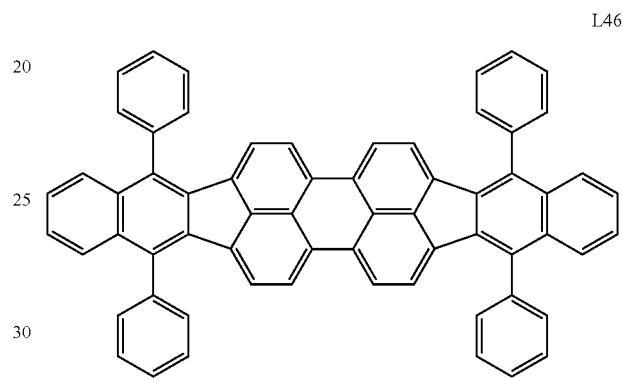

6. A 40 nm electron-transporting layer (ETL) of $Alq_3$ or a mixture of Cpd-1 (rubrene) and metal complex MC-16, see Table 9, was vacuum-deposited over the LEL.
7. 0.5 nm layer of lithium fluoride was vacuum deposited onto the ETL, followed by a 100 nm layer of aluminum, to form a cathode layer.

The above sequence completes the deposition of the EL device. The device is then hermetically packaged in a dry glove box for protection against ambient environment.

The devices thus formed were tested for drive voltage and luminous efficiency at an operating current of 20 mA/cm² and the results are reported in Table 9.

TABLE 9

Device data for 9-1 through 9-6, Example 10.

| Device | Example | % $Alq_3$ | % MC-16 | % Cpd-1 | Volt.[1] (V) | Luminance Efficiency (W/A) | CIE x/y |
|---|---|---|---|---|---|---|---|
| 9-1 | Comparative | 100 | 0 | 0 | 7.1 | 0.058 | 0.645 0.350 |
| 9-2 | Comparative | 0 | 100 | 0 | 22.0 | 0.0015 | 0.656 0.342 |
| 9-3 | Comparative | 75 | 25 | 0 | 7.8 | 0.070 | 0.648 0.348 |
| 9-4 | Inventive | 0 | 70 | 30 | 5.3 | 0.128 | 0.658 0.341 |
| 9-5 | Inventive | 0 | 50 | 50 | 5.3 | 0.114 | 0.658 0.341 |
| 9-6 | Inventive | 0 | 25 | 75 | 5.3 | 0.101 | 0.658 0.341 |

[1]The voltage needed to produce an operating current of 20 mA/cm²

As illustrated in the inventive examples of Table 9, when the electron-transporting layer of a device consists of the metal complex MC-16 mixed with carbocycle Cpd-1, one can obtain a reduction in the device voltage with increased luminance efficiency and improved red color compared to the comparison devices; example 9-1, Alq$_3$ (100%) or example 9-2, MC-16 (100%), or example 9-3, a mixture of MC-16 (25%) and Alq$_3$ (75%) which falls outside the scope of the current invention.

Example 11

Fabrication of Devices 10-1 Through 10-6

A series of EL devices (10-1 through 10-6) were constructed in the following manner.
1. A glass substrate coated with an 85 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL1) by plasma-assisted deposition of CHF$_3$ as described in U.S. Pat. No. 6,208,075
3. Next a layer of hole-transporting material 4,4'-Bis[N-(1-naphthyl)-N-phenylamino]biphenyl (NPB) was deposited to a thickness of 75 nm.
4. A 20 nm light-emitting layer (LEL) of Cpd-12 with 1.5 volume % of blue dopant L55 was then deposited.

5.

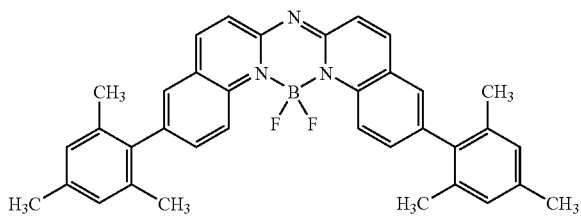

L55

6. A 35 nm electron-transporting layer (ETL) of Alq$_3$ or a mixture of MC-16 and Cpd-12, see Table 8, was vacuum-deposited over the LEL.
7. 0.5 nm layer of lithium fluoride was vacuum deposited onto the ETL, followed by a 150 nm layer of aluminum, to form a cathode layer.

The above sequence completes the deposition of the EL device. The device is then hermetically packaged in a dry glove box for protection against ambient environment.

The devices thus formed were tested for drive voltage and luminous efficiency at an operating current of 20 mA/cm$^2$ and the results are reported in Table 10.

TABLE 10

Device data for 10-1 through 10-6, Example 11.

| Device | Example | % Alq$_3$ | % MC-16 | % Cpd-12 | Volt.[1] (V) | Luminance Efficiency (W/A) | CIE x/y | |
|---|---|---|---|---|---|---|---|---|
| 10-1 | Comparative | 100 | 0 | 0 | 6.5 | 0.051 | 0.159 | 0.170 |
| 10-2 | Comparative | 0 | 100 | 0 | 19.7 | 0.0016 | 0.141 | 0.127 |
| 10-3 | Inventive | 0 | 90 | 10 | 10.7 | 0.041 | 0.142 | 0.116 |
| 10-4 | Inventive | 0 | 75 | 25 | 6.1 | 0.132 | 0.142 | 0.128 |
| 10-5 | Inventive | 0 | 50 | 50 | 5.5 | 0.133 | 0.142 | 0.129 |
| 10-6 | Inventive | 0 | 25 | 75 | 5.7 | 0.122 | 0.142 | 0.128 |

[1]The voltage needed to produce an operating current of 20 mA/cm$^2$

As illustrated in the inventive examples of Table 10, when the electron-transporting layer of a device consists of the metal complex MC-16 mixed with carbocycle Cpd-12, one can obtain a reduction in the device voltage, with excellent luminance efficiency and good CIE color coordinates compared to the comparison devices; example 10-1, Alq$_3$ (100%) or example 10-2, MC-16 (100%).

Example 12

Fabrication of Devices 11-1 Through 11-6

A series of EL devices (11-1 through 11-6) were constructed in an identical manner as described for Example 11, except that the metal complex MC-16 was replaced with MC-3.

The devices thus formed were tested for drive voltage and luminous efficiency at an operating current of 20 mA/cm$^2$ and the results are reported in Table 11.

TABLE 11

Device data for 11-1 through 11-6, Example 12.

| Device | Example | % Alq$_3$ | % MC-3 | % Cpd-12 | Volt.[1] (V) | Luminance Efficiency (W/A) | CIE x/y | |
|---|---|---|---|---|---|---|---|---|
| 10-1 | Comparative | 100 | 0 | 0 | 8.0 | 0.053 | 0.165 | 0.181 |
| 10-3 | Inventive | 0 | 90 | 10 | 9.2 | 0.047 | 0.150 | 0.139 |
| 10-4 | Inventive | 0 | 75 | 25 | 7.1 | 0.091 | 0.149 | 0.135 |
| 10-5 | Inventive | 0 | 50 | 50 | 6.4 | 0.118 | 0.151 | 0.143 |
| 10-6 | Inventive | 0 | 25 | 75 | 8.2 | 0.086 | 0.148 | 0.143 |

[1]The voltage needed to produce an operating current of 20 mA/cm$^2$

As illustrated in the inventive examples of Table 11, when the electron-transporting layer of a device consists of the metal complex MC-3 mixed with carbocycle Cpd-12, one can obtain a reduction in the device voltage, with excellent luminance efficiency and good CIE color coordinates compared to the comparison device; example 10-1, Alq$_3$ (100%).

Example 13

Fabrication of Devices 12-1 Through 12-6

A series of EL devices (12-1 through 12-6) was constructed in an identical manner as described for Example 11, except that the carbocycle Cpd-12 in both the LEL and ETL was replaced with Cpd-10.

The devices thus formed were tested for drive voltage and luminous efficiency at an operating current of 20 mA/cm$^2$ and the results are reported in Table 12.

TABLE 12

Device data for 12-1 through 12-6, Example 13.

| Device | Example | % Alq$_3$ | % MC-16 | % Cpd-10 | Volt.[1] (V) | Luminance Efficiency (W/A) | CIE x/y | |
|---|---|---|---|---|---|---|---|---|
| 12-1 | Comparative | 100 | 0 | 0 | 6.6 | 0.055 | 0.152 | 0.141 |
| 12-2 | Comparative | 0 | 0 | 100 | 10.2 | 0.004 | 0.139 | 0.108 |
| 12-3 | Inventive | 0 | 10 | 90 | 7.4 | 0.070 | 0.140 | 0.112 |
| 12-4 | Inventive | 0 | 25 | 75 | 6.6 | 0.111 | 0.140 | 0.109 |
| 12-5 | Inventive | 0 | 50 | 50 | 6.3 | 0.134 | 0.140 | 0.109 |
| 12-6 | Inventive | 0 | 75 | 25 | 6.4 | 0.092 | 0.140 | 0.112 |

[1]The voltage needed to produce an operating current of 20 mA/cm$^2$

As illustrated in the inventive examples of Table 12, when the electron-transporting layer of a device consists of the metal complex MC-16 mixed with carbocycle Cpd-10, one can obtain a reduction in the device voltage, with excellent luminance efficiency and good CIE color coordinates compared to the comparison devices; example 12-1, Alq$_3$ (100%) and example 12-2, Cpd-10 (100%). Although comparative example 12-1 shows good voltage, the luminance efficiency is inferior to the inventive examples.

Example 14

Fabrication of Devices 13-1 Through 13-6

A series of EL devices (13-1 through 13-6) was constructed in an identical manner as described for Example 11, except that the carbocycle Cpd-12 in both the LEL and the ETL was replaced with Cpd-10 and metal complex MC-16 was replaced with MC-3.

The devices thus formed were tested for drive voltage and luminous efficiency at an operating current of 20 mA/cm$^2$ and the results are reported in Table 13.

TABLE 13

Device data for 13-1 through 13-6, Example 14.

| Device | Example | % Alq$_3$ | % MC-3 | % Cpd-10 | Volt.[1] (V) | Luminance Efficiency (W/A) | CIE x/y | |
|---|---|---|---|---|---|---|---|---|
| 13-1 | Comparative | 100 | 0 | 0 | 6.6 | 0.060 | 0.151 | 0.139 |
| 13-2 | Comparative | 0 | 0 | 100 | 10.6 | 0.0057 | 0.139 | 0.108 |
| 13-3 | Inventive | 0 | 10 | 90 | 8.9 | 0.082 | 0.140 | 0.110 |
| 13-4 | Inventive | 0 | 25 | 75 | 7.7 | 0.091 | 0.140 | 0.109 |
| 13-5 | Inventive | 0 | 50 | 50 | 6.8 | 0.103 | 0.141 | 0.112 |
| 13-6 | Inventive | 0 | 75 | 25 | 6.6 | 0.101 | 0.141 | 0.111 |

[1]The voltage needed to produce an operating current of 20 mA/cm$^2$

As illustrated in the inventive examples of Table 13, when the electron-transporting layer of a device consists of the metal complex MC-3 mixed with carbocycle Cpd-10, one can obtain a device voltage similar to comparison 13-1 but better than comparison 13-2. However, the luminance efficiency and CIE color coordinates of the examples of the invention are excellent when compared to these comparison devices.

Example 15

Fabrication of Devices 14-1 Through 14-6

A series of EL devices (14-1 through 14-6) was constructed in an identical manner as described for Example 11, except that the carbocycle Cpd-12 was replaced with Cpd-9 and metal complex MC-16 was replaced with MC-3.

The devices thus formed were tested for drive voltage and luminous efficiency at an operating current of 20 mA/cm$^2$ and the results are reported in Table 14.

TABLE 14

Device data for 14-1 through 14-6, Example 15.

| Device | Example | % Alq$_3$ | % MC-3 | % Cpd-9 | Volt.[1] (V) | Luminance Efficiency (W/A) | CIE x/y | |
|---|---|---|---|---|---|---|---|---|
| 14-1 | Comparative | 100 | 0 | 0 | 6.7 | 0.057 | 0.150 | 0.130 |
| 14-2 | Comparative | 0 | 0 | 100 | 10.3 | 0.0053 | 0.140 | 0.104 |
| 14-3 | Inventive | 0 | 10 | 90 | 7.6 | 0.083 | 0.141 | 0.106 |
| 14-4 | Inventive | 0 | 25 | 75 | 7.7 | 0.085 | 0.141 | 0.107 |
| 14-5 | Inventive | 0 | 50 | 50 | 6.6 | 0.097 | 0.141 | 0.108 |
| 14-6 | Inventive | 0 | 75 | 25 | 6.5 | 0.097 | 0.141 | 0.108 |

[1]The voltage needed to produce an operating current of 20 mA/cm$^2$

As illustrated in the inventive examples of Table 14, when the electron-transporting layer of a device consists of the metal complex MC-3 mixed with carbocycle Cpd-9, one can obtain a device voltage similar to comparison 14-1 but better than comparison 14-2. However, the luminance efficiency and CIE color coordinates of the examples of the invention are excellent when compared to these comparison devices.

Example 16

Fabrication of Devices 15-1 Through 15-6

A series of EL devices (15-1 through 15-6) was constructed in an identical manner as described for Example 11, except that the metal complex MC-16 was replaced with MC-20.

The devices thus formed were tested for drive voltage and luminous efficiency at an operating current of 20 mA/cm$^2$ and the results are reported in Table 15.

TABLE 15

Device data for 15-1 through 15-6, Example 16.

| Device | Example | % Alq$_3$ | % MC-20 | % Cpd-12 | Volt.[1] (V) | Luminance Efficiency (W/A) | CIE x/y | |
|---|---|---|---|---|---|---|---|---|
| 15-1 | Comparative | 100 | 0 | 0 | 6.5 | 0.051 | 0.160 | 0.171 |
| 15-2 | Inventive | 0 | 100 | 0 | 6.4 | 0.048 | 0.145 | 0.134 |
| 15-3 | Inventive | 0 | 90 | 10 | 6.7 | 0.047 | 0.145 | 0.134 |
| 15-4 | Inventive | 0 | 75 | 25 | 5.5 | 0.079 | 0.145 | 0.137 |
| 15-5 | Inventive | 0 | 50 | 50 | 5.1 | 0.103 | 0.145 | 0.139 |
| 15-6 | Inventive | 0 | 25 | 75 | 5.8 | 0.091 | 0.145 | 0.139 |

[1]The voltage needed to produce an operating current of 20 mA/cm$^2$

As illustrated in the inventive examples of Table 15, when the electron-transporting layer of a device consists of the metal complex MC-20 or mixed with carbocycle Cpd-12, one can obtain a device voltage similar or lower to comparison 15-1. However, the luminance efficiency and CIE color coordinates of the examples of the invention are excellent when compared to the comparison devices.

Example 17

Fabrication of Devices 16-1 Through 16-6

A series of EL devices (16-1 through 16-6) was constructed in an identical manner as described for Example 9, except that the carbocycle Cpd-1, was replaced with Cpd-12.

The devices thus formed were tested for drive voltage and luminous efficiency at an operating current of 20 mA/cm$^2$ and the results are reported in Table 16.

TABLE 16

Device data for 16-1 through 16-6, Example 17.

| Device | Example | % Alq$_3$ | % MC-20 | % Cpd-12 | Volt.[1] (V) | Luminance Efficiency (W/A) | CIE x/y |
|---|---|---|---|---|---|---|---|
| 16-1 | Comparative | 100 | 0 | 0 | 6.8 | 0.021 | 0.333 0.550 |
| 16-2 | Inventive | 0 | 100 | 0 | 6.3 | 0.020 | 0.329 0.544 |
| 16-3 | Inventive | 0 | 10 | 90 | 7.9 | 0.021 | 0.325 0.548 |
| 16-4 | Inventive | 0 | 25 | 75 | 8.4 | 0.020 | 0.346 0.555 |
| 16-5 | Inventive | 0 | 50 | 50 | 5.1 | 0.021 | 0.336 0.547 |
| 16-6 | Inventive | 0 | 75 | 25 | 5.6 | 0.021 | 0.330 0.546 |

[1]The voltage needed to produce an operating current of 20 mA/cm$^2$

As illustrated in the inventive examples of Table 16, when the electron-transporting layer of a device consists of the metal complex MC-20 or mixed with carbocycle Cpd-12, on average, one can obtain a device voltage similar to or lower than comparison 16-1 with similar luminance efficiency and CIE color coordinates of the examples of the invention.

Example 18

Fabrication of Devices 17-1 Through 17-6

A series of EL devices (17-1 through 17-6) was constructed in an identical manner to that described for Example 11, except that L55 was replaced with L48 at 3.0 volume %.

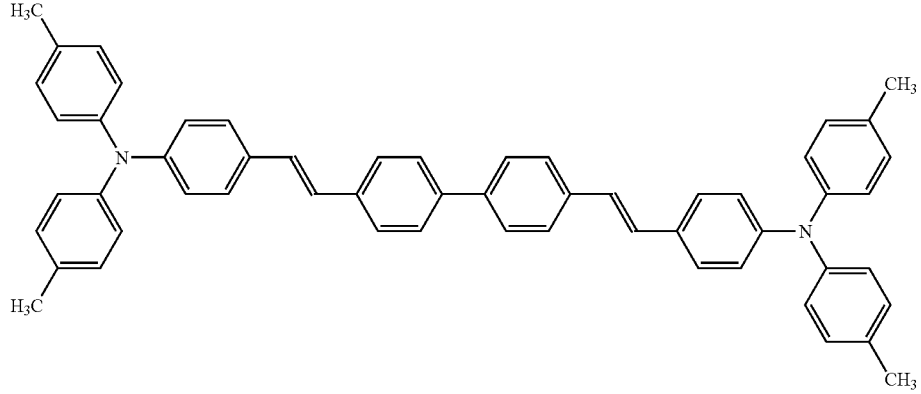

L48

And the metal complex MC-16 was replaced with MC-3.

The devices thus formed were tested for drive voltage and luminous efficiency at an operating current of 20 mA/cm² and the results are reported in Table 17.

TABLE 17

Device data for 17-1 through 17-6, Example 18.

| Device | Example | % Alq$_3$ | % MC-3 | % Cpd-12 | Volt.[1] (V) | Luminance Efficiency (W/A) | CIE x/y | |
|---|---|---|---|---|---|---|---|---|
| 17-1 | Comparative | 100 | 0 | 0 | 6.5 | 0.064 | 0.164 | 0.279 |
| 17-2 | Comparative | 0 | 100 | 0 | 10.1 | 0.037 | 0.160 | 0.272 |
| 17-3 | Inventive | 0 | 90 | 10 | 5.2 | 0.129 | 0.156 | 0.270 |
| 17-4 | Inventive | 0 | 75 | 25 | 5.4 | 0.127 | 0.153 | 0.255 |
| 17-5 | Inventive | 0 | 50 | 50 | 6.8 | 0.094 | 0.155 | 0.266 |
| 17-6 | Inventive | 0 | 25 | 75 | 7.7 | 0.071 | 0.155 | 0.262 |

[1]The voltage needed to produce an operating current of 20 mA/cm²

As illustrated in the inventive examples of Table 17, when the electron-transporting layer of a device consists of the metal complex MC-3 mixed with carbocycle Cpd-12, one can obtain a reduction in the device voltage, with excellent luminance efficiency and good CIE color coordinates compared to the comparison devices; example 17-1, Alq$_3$ (100%) or example 17-2, MC-3 (100%).

Example 19

Fabrication of Devices 18-1 Through 18-6

A series of EL devices (18-1 through 18-6) was constructed in an identical manner to that described for Example 11, except that L55 was replaced with L48 at 3.0 volume %.

The devices thus formed were tested for drive voltage and luminous efficiency at an operating current of 20 mA/cm² and the results are reported in Table 17.

TABLE 18

Device data for 18-1 through 18-6, Example 19.

| Device | Example | % Alq$_3$ | % MC-16 | % Cpd-12 | Volt.[1] (V) | Luminance Efficiency (W/A) | CIE x/y | |
|---|---|---|---|---|---|---|---|---|
| 18-1 | Comparative | 100 | 0 | 0 | 6.5 | 0.064 | 0.164 | 0.279 |
| 18-2 | Comparative | 0 | 100 | 0 | 24 | — | — | — |
| 18-3 | Inventive | 0 | 90 | 10 | 10.3 | 0.047 | 0.158 | 0.246 |
| 18-4 | Inventive | 0 | 75 | 25 | 6.4 | 0.134 | 0.158 | 0.264 |
| 18-5 | Inventive | 0 | 50 | 50 | 5.9 | 0.140 | 0.155 | 0.260 |
| 18-6 | Inventive | 0 | 25 | 75 | 6.1 | 0.117 | 0.155 | 0.257 |

[1]The voltage needed to produce an operating current of 20 mA/cm²

As illustrated in the inventive examples of Table 18, when the electron-transporting layer of a device consists of the metal complex MC-16 mixed with carbocycle Cpd-12, one can obtain a significant reduction in the device voltage, with excellent luminance efficiency and good CIE color coordinates compared to the comparison devices; example 18-1, Alq₃ (100%) or example 18-2, MC-16 (100%). In example 18-2 the drive voltage was too high to provide any meaning data. Furthermore, luminance efficiency can be improved when amine containing styryl compounds are employed as the emitter as shown by comparing this Example with Example 11.

Example 20

Fabrication of Devices 19-1 Through 19-6

A series of EL devices (19-1 through 19-6) was constructed in an identical manner to that described for Example 11, except that L55 was replaced with L47 at 3.0 volume % in the LEL, Cpd-12 in the LEL was replaced with carbocycle Cpd-9, MC-16 in the ETL was replaced with MC-3 and Cpd-12 in the ETL was replaced with carbocycle Cpd-3.

As illustrated in the inventive examples of Table 19, when the electron-transporting layer of a device consists of the metal complex MC-3 mixed with carbocycle Cpd-3, one can obtain a reduction in the device voltage, with excellent luminance efficiency and good CIE color coordinates compared to the comparison devices; example 19-1, Alq₃ (100%) or example 19-2, MC-3 (100%).

Example 21

Fabrication of Devices 20-1 Through 20-5

A series of EL devices (20-1 through 20-5) was constructed in an identical manner as described for Example 9, except that the metal complex MC-20 in the ETL was replaced with MC-28.

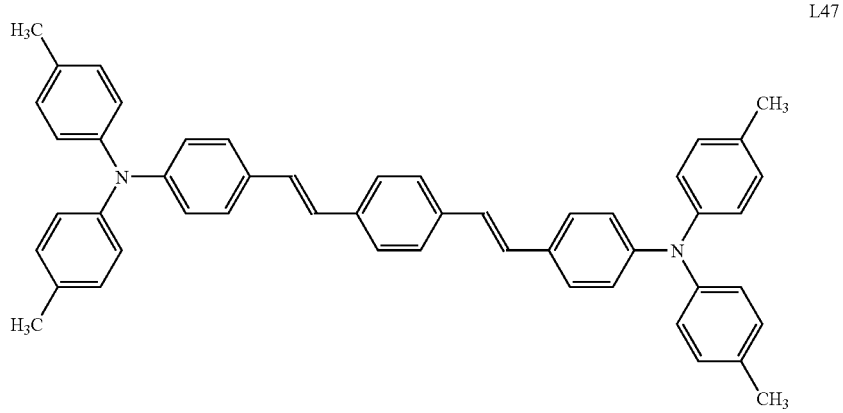

L47

The devices thus formed were tested for drive voltage and luminous efficiency at an operating current of 20 mA/cm² and the results are reported in Table 17.

The devices thus formed were tested for drive voltage and luminous efficiency at an operating current of 20 mA/cm² and the results are reported in Table 20.

TABLE 19

Device data for 19-1 through 19-6; Example 20.

| Device | Example | % Alq₃ | % MC-3 | % Cpd-3 | Volt.[1] (V) | Luminance Efficiency (W/A) | CIE x/y | |
|---|---|---|---|---|---|---|---|---|
| 19-1 | Comparative | 100 | 0 | 0 | 7.1 | 0.100 | 0.161 | 0.343 |
| 19-2 | Comparative | 0 | 100 | 0 | 10.9 | 0.062 | 0.162 | 0.343 |
| 19-3 | Inventive | 0 | 90 | 10 | 11.7 | 0.019 | 0.223 | 0.346 |
| 19-4 | Inventive | 0 | 75 | 25 | 6.7 | 0.117 | 0.170 | 0.337 |
| 19-5 | Inventive | 0 | 50 | 50 | 5.3 | 0.133 | 0.169 | 0.337 |
| 19-6 | Inventive | 0 | 25 | 75 | 5.9 | 0.120 | 0.172 | 0.338 |

[1]The voltage needed to produce an operating current of 20 mA/cm²

TABLE 20

Device data for 20-1 through 20-5, Example 21.

| Device | Example | % MC-28 | % Cpd-1 | Volt.[1] (V) | Luminance Efficiency (W/A) | CIE x/y | |
|---|---|---|---|---|---|---|---|
| 20-1 | Inventive | 100 | 0 | 9.8 | 0.014 | 0.330 | 0.541 |
| 20-2 | Inventive | 90 | 10 | 9.9 | 0.011 | 0.390 | 0.527 |
| 20-3 | Inventive | 75 | 25 | 6.2 | 0.020 | 0.341 | 0.542 |
| 20-4 | Inventive | 50 | 50 | 5.0 | 0.020 | 0.339 | 0.542 |
| 20-5 | Inventive | 25 | 75 | 5.0 | 0.019 | 0.334 | 0.541 |

[1]The voltage needed to produce an operating current of 20 mA/cm$^2$

As illustrated in the inventive examples of Table 20, when the electron-transporting layer of a device consists of the metal complex MC-28 or mixed with carbocycle Cpd-1, one can obtain good device voltage, luminance efficiency and CIE color coordinates of the examples of the invention.

Example 22

Fabrication of Devices 21-1 Through 21-5

A series of EL devices (21-1 through 21-5) was constructed in an identical manner as described for Example 9, except that the metal complex MC-20 in the ETL was replaced with MC-30.

The devices thus formed were tested for drive voltage and luminous efficiency at an operating current of 20 MA/cm$^2$ and the results are reported in Table 21.

TABLE 21

Device data for 21-1 through 21-5, Example 22.

| Device | Example | % MC-30 | % Cpd-1 | Volt.[1] (V) | Luminance Efficiency (W/A) | CIE x/y | |
|---|---|---|---|---|---|---|---|
| 21-1 | Inventive | 100 | 0 | 8.8 | 0.016 | 0.325 | 0.543 |
| 21-2 | Inventive | 90 | 10 | 8.8 | 0.013 | 0.355 | 0.535 |
| 21-3 | Inventive | 75 | 25 | 6.7 | 0.017 | 0.337 | 0.542 |
| 21-4 | Inventive | 50 | 50 | 5.7 | 0.018 | 0.332 | 0.544 |
| 21-5 | Inventive | 25 | 75 | 5.6 | 0.017 | 0.333 | 0.542 |

[1]The voltage needed to produce an operating current of 20 mA/cm$^2$

As illustrated in the inventive examples of Table 21, on average, when the electron-transporting layer of a device consists of the metal complex MC-30 or mixed with carbocycle Cpd-1, one can obtain good device voltage, luminance efficiency and CIE color coordinates of the examples of the invention.

Example 23

Fabrication of Devices 22-1 Through 22-4

A series of EL devices (22-1 through 22-4) were constructed in the following manner.

1. A glass substrate coated with an 85 nm layer of indium-tin oxide (ITO), as the anode, was sequentially ultrasonicated in a commercial detergent, rinsed in deionized water, degreased in toluene vapor and exposed to oxygen plasma for about 1 min.
2. Over the ITO was deposited a 1 nm fluorocarbon (CFx) hole-injecting layer (HIL1) by plasma-assisted deposition of CHF$_3$ as described in U.S. Pat. No. 6,208,075.
3. Next a layer of hole-transporting material 4,4'-Bis[N-(1-naphthyl)-N-phenylamino]biphenyl (NPB) was deposited to a thickness of 75 nm.
4. A 35 nm light-emitting layer (LEL) of Cpd-1 with 0.5 volume % of red dopant L46 was then deposited.
5. A 35 nm electron-transporting layer (ETL) of a mixture of MC-29 and Cpd-1, see Table 22, was vacuum-deposited over the LEL.
6. 0.5 nm layer of lithium fluoride was vacuum deposited onto the ETL, followed by a 150 nm layer of aluminum, to form a cathode layer.

The above sequence completes the deposition of the EL device. The device is then hermetically packaged in a dry glove box for protection against ambient environment.

The devices thus formed were tested for drive voltage and luminous efficiency at an operating current of 20 mA/cm$^2$ and the results are reported in Table 22.

TABLE 22

Device data for 22-1 through 22-4, Example 23.

| Device | Example | % MC-29 | % Cpd-1 | Volt.[1] (V) | Luminance Efficiency (W/A) | CIE x/y | |
|---|---|---|---|---|---|---|---|
| 22-1 | Comparative | 0 | 100 | 6.7 | 0.00034 | 0.653 | 0.345 |
| 22-2 | Inventive | 90 | 10 | 6.8 | 0.020 | 0.629 | 0.370 |
| 22-3 | Inventive | 75 | 25 | 6.2 | 0.052 | 0.644 | 0.355 |
| 22-4 | Inventive | 50 | 50 | 5.8 | 0.049 | 0.645 | 0.354 |

[1]The voltage needed to produce an operating current of 20 mA/cm$^2$

As illustrated in the inventive examples of Table 22, when the electron-transporting layer of a device consists of the metal complex MC-29 mixed with carbocycle Cpd-1, one can obtain a reduction in the device voltage, with excellent luminance efficiency and good CIE color coordinates compared to the comparison device; example 22-1, Cpd-1 (100%).

Example 24

Fabrication of Devices 23-1 Through 23-6

A series of EL devices (23-1 through 23-6) was constructed in an identical manner as described for Example 23, except that the metal complex MC-29 in the ETL was replaced with MC-28.

The devices thus formed were tested for drive voltage and luminous efficiency at an operating current of 20 mA/cm$^2$ and the results are reported in Table 23.

TABLE 23

Device data for 23-1 through 23-6, Example 24.

| Device | Example | % MC-28 | % Cpd-1 | Volt.[1] (V) | Luminance Efficiency (W/A) | CIE x/y | |
|---|---|---|---|---|---|---|---|
| 23-1 | Comparative | 0 | 100 | 6.5 | 0.002 | 0.654 | 0.344 |
| 23-2 | Inventive | 100 | 0 | 7.2 | 0.018 | 0.632 | 0.354 |
| 23-3 | Inventive | 90 | 10 | 6.7 | 0.018 | 0.619 | 0.380 |
| 23-4 | Inventive | 75 | 25 | 6.7 | 0.050 | 0.642 | 0.358 |
| 23-5 | Inventive | 50 | 50 | 5.4 | 0.054 | 0.645 | 0.354 |
| 23-6 | Inventive | 25 | 75 | 5.6 | 0.046 | 0.651 | 0.348 |

[1]The voltage needed to produce an operating current of 20 mA/cm$^2$

As illustrated in the inventive examples of Table 23, on average, when the electron-transporting layer of a device consists of the metal complex MC-28 or mixed with carbocycle Cpd-1, one can obtain good device voltage, luminance efficiency and CIE color coordinates of the examples of the invention.

Example 25

Fabrication of Devices 24-1 Through 24-6

A series of EL devices (24-1 through 24-6) was constructed in an identical manner as described for Example 23, except that the metal complex MC-29 in the ETL was replaced with MC-30.

The devices thus formed were tested for drive voltage and luminous efficiency at an operating current of 20 mA/cm$^2$ and the results are reported in Table 24.

TABLE 24

Device data for 24-1 through 24-6, Example 25.

| Device | Example | % MC-30 | % Cpd-1 | Volt.[1] (V) | Luminance Efficiency (W/A) | CIE x/y | |
|---|---|---|---|---|---|---|---|
| 24-1 | Comparative | 0 | 100 | 4.7 | 0.00041 | 0.654 | 0.344 |
| 24-2 | Inventive | 100 | 0 | 6.7 | 0.010 | 0.634 | 0.359 |
| 24-3 | Inventive | 90 | 10 | 5.4 | 0.017 | 0.628 | 0.370 |
| 24-4 | Inventive | 75 | 25 | 4.3 | 0.041 | 0.641 | 0.357 |
| 24-5 | Inventive | 50 | 50 | 4.2 | 0.060 | 0.650 | 0.349 |
| 24-6 | Inventive | 25 | 75 | 4.4 | 0.040 | 0.651 | 0.348 |

[1] The voltage needed to produce an operating current of 20 mA/cm$^2$

As illustrated in the inventive examples of Table 24, on average, when the electron-transporting layer of a device consists of the metal complex MC-30 or mixed with carbocycle Cpd-1, one can obtain good device voltage, luminance efficiency and CIE color coordinates of the examples of the invention.

Example 26

Fabrication of Devices 25-1 Through 25-6

A series of EL devices (25-1 through 25-6) was constructed in an identical manner as described for Example 10, except that the carbocycle Cpd-1 in the ETL was replaced with Cpd-12.

The devices thus formed were tested for drive voltage and luminous efficiency at an operating current of 20 mA/cm$^2$ and the results are reported in Table 25.

TABLE 25

Device data for 25-1 through 25-6, Example 26.

| Device | Example | % Alq$_3$ | % MC-16 | % Cpd-12 | Volt.[1] (V) | Luminance Efficiency (W/A) | CIE x/y | |
|---|---|---|---|---|---|---|---|---|
| 25-1 | Comparative | 100 | 0 | 0 | 7.1 | 0.058 | 0.645 | 0.350 |
| 25-2 | Comparative | 0 | 100 | 0 | 22.0 | 0.0015 | 0.656 | 0.342 |
| 25-3 | Comparative | 25 | 0 | 75 | 7.1 | 0.055 | 0.655 | 0.343 |
| 25-4 | Inventive | 0 | 70 | 30 | 7.6 | 0.077 | 0.658 | 0.341 |
| 25-5 | Inventive | 0 | 50 | 50 | 7.3 | 0.084 | 0.658 | 0.341 |
| 25-6 | Inventive | 0 | 25 | 75 | 7.3 | 0.079 | 0.659 | 0.340 |

[1] The voltage needed to produce an operating current of 20 mA/cm$^2$

As illustrated in the inventive examples of Table 25, when the electron-transporting layer of a device consists of the metal complex MC-16 mixed with carbocycle Cpd-12, one obtains similar drive voltage with increased luminance efficiency and improved red color compared to the comparison devices; example 25-1, Alq$_3$ (100%) or example 25-2, MC-16 (100%), or example 25-3, a mixture of Alq$_3$ (25%) and Cpd-12 (75%) which falls outside the scope of the current invention.

The entire contents of the patents and other publications referred to in this specification are incorporated herein by reference. The invention has been described in detail with particular reference to certain preferred embodiments thereof, but it will be understood that variations and modifications can be effected within the spirit and scope of the invention.

| PARTS LIST | |
|---|---|
| 101 | Substrate |
| 103 | Anode |
| 105 | Hole-Injecting layer (Hit) |
| 107 | Hole-Transporting Layer (HTL) |
| 109 | Light-Emitting layer (LEL) |
| 111 | Electron-Transporting layer (ETL) |
| 112 | Electron-Injecting layer (EIL) |
| 113 | Cathode |
| 150 | Power Source |
| 160 | Conductor |

The invention claimed is:

1. An OLED device comprising a cathode, a light emitting layer and an anode, in that order, and, having located between the cathode and the light emitting layer, a non-light emitting further layer containing;

(a) a carbocyclic fused ring aromatic compound comprising greater than 10% of the layer by volume and represented by Formula (2):

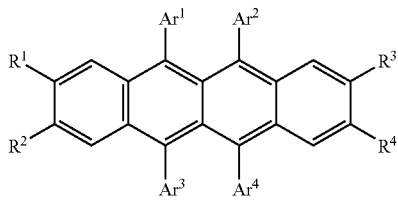

(2)

wherein:

Ar¹—Ar⁴ represent independently selected aromatic groups;

R¹-R⁴ represent hydrogen or substituents independently selected from methyl, t-butyl, fluoro groups; and (b) a cyclometallated complex comprising 20% or greater of the layer by volume and represented by Formula (4')

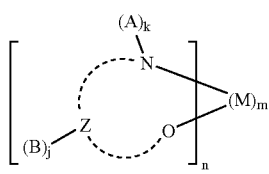

(4')

wherein:

Z and the dashed arc represent three atoms and the bonds necessary to complete a 6-membered ring with M;

each A represents H or a substituent and each B represents an independently selected substituent on the Z atoms, provided that two or more substituents may combine to form a fused ring or a fused ring system;

j is 3 and k is 1;

M represents an alkali metal or alkaline earth metal; and m and n are independently selected integers selected to provide a neutral charge on the complex.

2. The device of claim 1 wherein the light emitting layer emits blue light.

3. The device of claim 1 wherein the light emitting layer emits green light.

4. The device of claim 1 wherein the light emitting layer emits red light.

5. The device of claim 1 wherein the further layer is adjacent to the light-emitting layer.

6. The device of claim 1 wherein the carbocyclic fused ring aromatic compound in the further layer comprises 15% or greater of the layer by volume.

7. The device of claim 1 wherein the carbocyclic fused ring aromatic fused ring aromatic compound in the further layer comprises 25% or greater of the layer by volume.

8. The device of claim 1 wherein the carbocyclic fused ring aromatic compound in the further layer comprises 50-80% of the layer by volume.

9. The device of claim 1 wherein R¹ is the same as R⁴ and neither are hydrogen, Ar¹ is the same as Ar⁴, and Ar² is the same as Ar³, in the compound of Formula (2).

10. The device of claim 1 wherein the carbocyclic fused ring aromatic compound is:

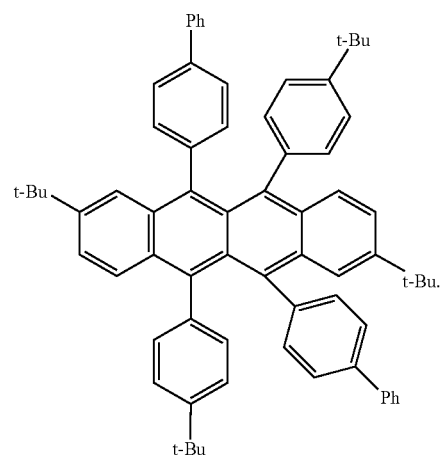

11. The device of claim 1 wherein the cyclometallated complex is selected from the group consisting of:

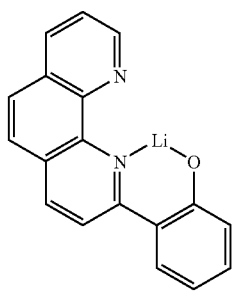

MC-20

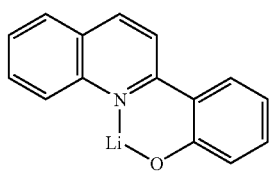

MC-28

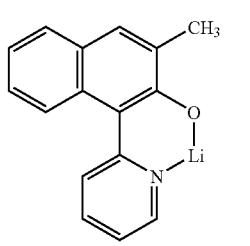

MC-29

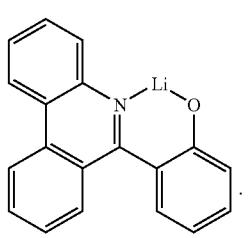

MC-30

12. The device of claim 1 wherein the cyclometallated complex comprises 20-60% of the layer by volume.

13. The device of claim 1 wherein the layer containing (a) and (b) also includes (c) an elemental metal having a work function less than 4.2 eV.

14. The device of claim 13 wherein said elemental metal is present in the amount of from 0.1% to 15% by volume of the total material in the layer.

15. The device of claim 1 wherein M in the compound of Formula (4') is lithium.

* * * * *